(12) United States Patent
Choi

(10) Patent No.: US 11,201,140 B2
(45) Date of Patent: Dec. 14, 2021

(54) SEMICONDUCTOR PACKAGES INCLUDING STACKED SUB-PACKAGES WITH INTERPOSING BRIDGES

(71) Applicant: SK hynix Inc., Icheon-si (KR)

(72) Inventor: Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 28 days.

(21) Appl. No.: 16/893,117

(22) Filed: Jun. 4, 2020

(65) Prior Publication Data

US 2021/0193622 A1 Jun. 24, 2021

(30) Foreign Application Priority Data

Dec. 24, 2019 (KR) .................. 10-2019-0174561

(51) Int. Cl.
*H01L 25/065* (2006.01)
*H01L 23/538* (2006.01)

(52) U.S. Cl.
CPC ...... *H01L 25/0657* (2013.01); *H01L 23/5384* (2013.01); *H01L 23/5385* (2013.01); *H01L 23/5386* (2013.01)

(58) Field of Classification Search
None
See application file for complete search history.

(56) References Cited

U.S. PATENT DOCUMENTS

| 2017/0018527 A1* | 1/2017 | Lee ............. H01L 23/49822 |
| 2019/0333894 A1* | 10/2019 | Eom ............. H01L 23/49838 |
| 2020/0075490 A1* | 3/2020 | Sung ............. H01L 23/5385 |
| 2021/0217700 A1* | 7/2021 | Choi ............. H01L 23/5385 |

FOREIGN PATENT DOCUMENTS

| KR | 101236798 B1 | 2/2013 |
| KR | 1020200025587 A | 3/2020 |

* cited by examiner

*Primary Examiner* — Zandra V Smith
*Assistant Examiner* — Lawrence C Tynes, Jr.
(74) *Attorney, Agent, or Firm* — William Park & Associates Ltd.

(57) ABSTRACT

A semiconductor package includes a first sub-package on an interconnection layer. A second sub-package and a third sub-package are sequentially stacked on the first sub-package. Each of the first to third sub-packages includes a semiconductor chip and an interposing bridge. The interposing bridge includes a first through via and a second through via. The second sub-package further includes a first redistributed line electrically connecting the semiconductor chip of the second sub-package to the first through via. The third sub-package further includes a second redistributed line electrically connecting the semiconductor chip of the third sub-package to the second through via.

21 Claims, 22 Drawing Sheets

SEMICONDUCTOR PACKAGES INCLUDING STACKED SUB-PACKAGES WITH INTERPOSING BRIDGES

CROSS-REFERENCE TO RELATED APPLICATIONS

The present application claims priority under 35 U.S.C. 119(a) to Korean Application No. 10-2019-0174561, filed on Dec. 24, 2019, which is incorporated herein by references in its entirety.

BACKGROUND

1. Technical Field

The present disclosure relates to semiconductor package technologies and, more particularly, to semiconductor packages including stacked sub-packages, each of which has one or more semiconductor chips and interposing bridges.

2. Related Art

Recently, a lot of effort has been focused on integrating a plurality of semiconductor chips into a single semiconductor package. That is, attempts to increase package integration density have been made to realize high performance semiconductor packages that process a large amount of data at a high speed with a multi-functional operation. For example, a system-in-package (SiP) technique may be regarded as an attractive candidate for realizing the high performance semiconductor packages.

As larger high-capacity batteries are increasingly in demand with the development of high performance mobile systems, a size and a thickness of other components included in the mobile systems have been reduced to maintain desirable form factors. Accordingly, compact system-in-packages or compact semiconductor packages are sought to realize the high performance mobile systems.

SUMMARY

According to an embodiment, a semiconductor package includes an interconnection layer, a first sub-package disposed on the interconnection layer, and a second sub-package and a third sub-package sequentially stacked on the first sub-package. The first sub-package includes a first semiconductor chip and a first interposing bridge. The first interposing bridge is spaced apart from the first semiconductor chip and configured to include a first layer of through vias. The second sub-package includes a second semiconductor chip, a second interposing bridge, and a first redistributed line. The second interposing bridge is e spaced apart from the second semiconductor chip and configured to include a second layer of through vias which overlap with respective through vias of the first layer of through vias and which are electrically connected to the respective through vias of the first layer of through vias. The first redistributed line electrically connects the second semiconductor chip to a first through via of the second layer of through vias. The third sub-package includes a third semiconductor chip, a third interposing bridge, and a second redistributed line. The third interposing bridge is spaced apart from the third semiconductor chip and configured to include a third layer of through vias which overlap with respective through vias of the second layer of through vias and which are electrically connected to the respective through vias of the second layer of through vias. The second redistributed line electrically connects the third semiconductor chip to a second through via of the third layer of through vias.

According to another embodiment, a semiconductor package includes an interconnection layer, a first sub-package, a second sub-package, a third sub-package, a fourth sub-package, and a fifth sub-package. The first sub-package is disposed on the interconnection layer. The second sub-package, the third sub-package, the fourth sub-package, and the fifth sub-package are sequentially stacked on the first sub-package. The first sub-package includes a first semiconductor chip and a first interposing bridge. The first interposing bridge is spaced apart from the first semiconductor chip and is configured to include a first layer of through vias. Each of the second and third sub-packages includes a second semiconductor chip, a second interposing bridge, and a first redistributed line. The second interposing bridge is spaced apart from the second semiconductor chip and is configured to include a second layer of through vias which overlap with respective through vias of the first layer of through vias and which are electrically connected to the respective through vias of the first layer of through vias. The first redistributed line electrically connects the second semiconductor chip to a first through via of the second layer of through vias. Each of the fourth and fifth sub-packages includes a third semiconductor chip, a third interposing bridge, and a second redistributed line. The third interposing bridge is spaced apart from the third semiconductor chip and is configured to include a third layer of through vias which overlap with respective through vias of the second layer of through vias and which are electrically connected to the respective through vias of the second layer of through vias. The second redistributed line electrically connects the third semiconductor chip to a second through via of the third layer of through vias.

According to yet another embodiment, a semiconductor package includes an interconnection layer, a first sub-package on the interconnection layer, and a second sub-package and a third sub-package sequentially stacked on the first sub-package. Each of the first, second, and third sub-packages includes a semiconductor chip and an interposing bridge. The interposing bridge is spaced apart from the semiconductor chip and is configured to include a first through via and a second through via. The second sub-package further includes a first redistributed line electrically connecting the semiconductor chip of the second sub-package to the first through via. The third sub-package further includes a second redistributed line electrically connecting the semiconductor chip of the third sub-package to the second through via.

DETAILED DESCRIPTION OF THE EMBODIMENTS

Figure 1:
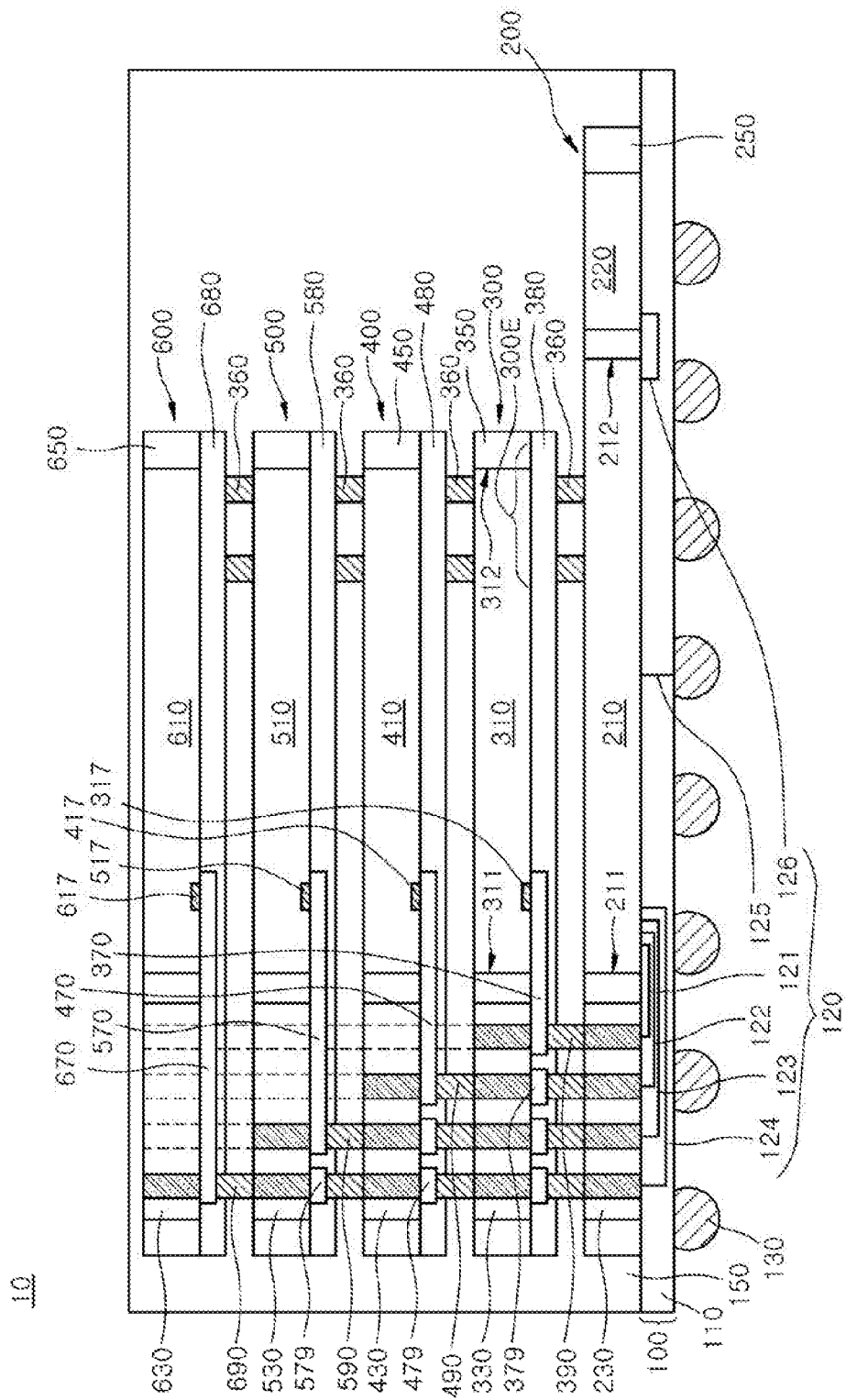
FIG. 1 is a cross-sectional view illustrating a semiconductor package according to an embodiment.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, but not used to indicate a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Semiconductor packages, in accordance with various embodiments, may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor packages may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
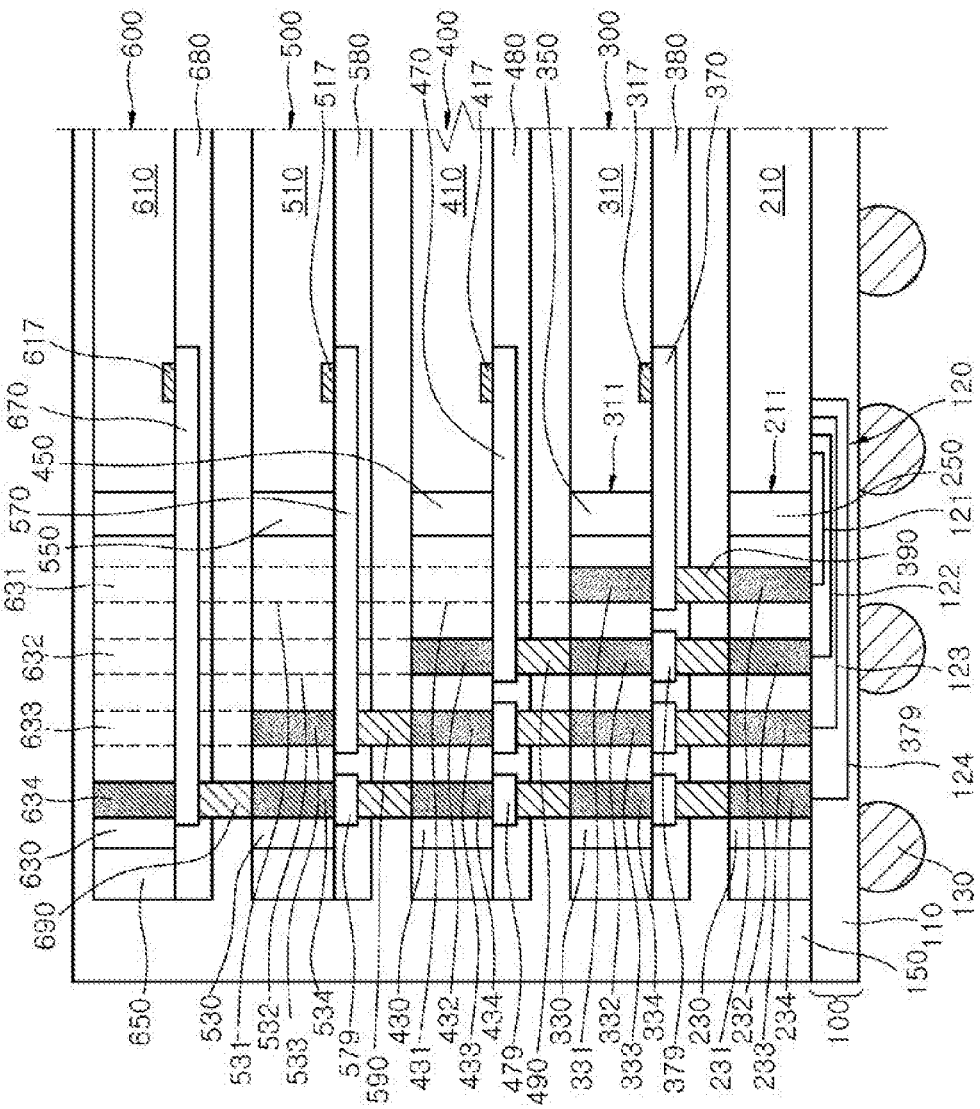
FIG. 2 is an enlarged view illustrating a stack portion of interposing bridges included in the semiconductor package of FIG. 1.

FIG. 1 is a cross-sectional view illustrating a semiconductor package 10 according to an embodiment. FIG. 2 is an enlarged view illustrating a stack portion of interposing bridges 230, 330, 430, 530, and 630 included in the semiconductor package 10 of FIG. 1.

Referring to FIGS. 1 and 2, the semiconductor package 10 may be configured to include a first sub-package 200 disposed on an interconnection layer 100 and second and third sub-packages 300 and 400 sequentially stacked on the first sub-package 200. The semiconductor package 10 may further include fourth and fifth sub-packages 500 and 600 sequentially and vertically stacked on the third sub-package 400.

The first to fifth sub-packages 200, 300, 400, 500, and 600 may constitute one module. Because the first to fifth sub-packages 200, 300, 400, 500, and 600 constitute one module, the semiconductor package 10 may be fabricated using an assembly process of a module. The first to fifth sub-packages 200, 300, 400, 500, and 600 may be vertically stacked to provide the semiconductor package 10 having a stack package structure. A structure of the first to fifth sub-packages 200, 300, 400, 500, and 600 vertically stacked may be similar to a structure of a package-on-package (PoP).

The semiconductor package 10 may be configured to further include a sixth encapsulant 150. The sixth encapsulant 150 may be disposed on the interconnection layer 100 to cover the first to fifth sub-packages 200, 300, 400, 500, and 600. The sixth encapsulant 150 may include at least one of various encapsulant materials. The sixth encapsulant 150 may be formed of a molding layer, for example, an epoxy molding compound (EMC) layer.

Figure 3:
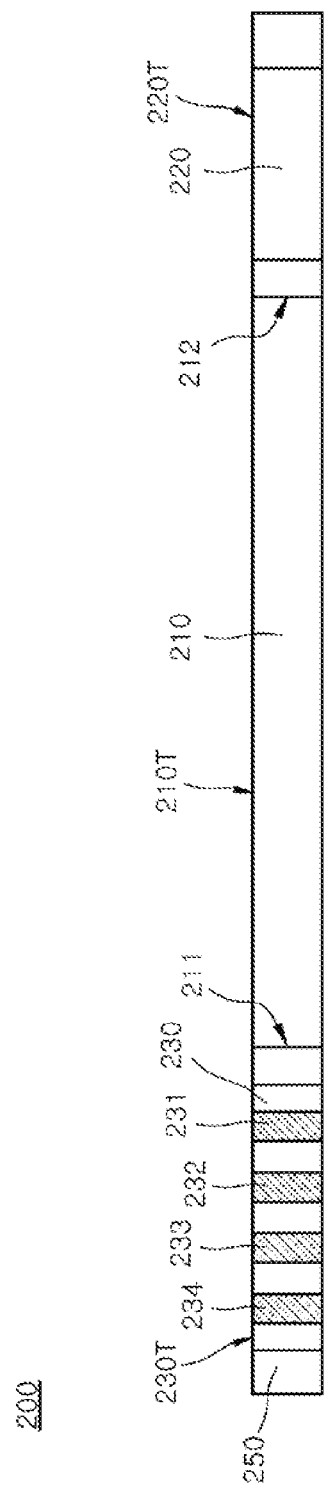
FIG. 3 is a cross-sectional view illustrating a first sub-package included in the semiconductor package of FIG. 1.

FIG. 3 is a cross-sectional view illustrating the first sub-package 200 included in the semiconductor package 10 of FIG. 1.

Referring to FIGS. 1 and 3, the first sub-package 200 may be configured to include a first semiconductor chip 210, an auxiliary semiconductor chip 220 (hereinafter, referred to as a sixth semiconductor chip), a first interposing bridge 230, and a first encapsulant 250. The first semiconductor chip 210 may be a processor chip such as an application processor (AP). The sixth semiconductor chip 220 may be a buffer memory chip providing a buffer memory used as a cache memory when the semiconductor package 10 or the first semiconductor chip 210 operates. The sixth semiconductor chip 220 may be a DRAM device.

The first interposing bridge 230 may be disposed to be laterally spaced apart from a first edge 211 of the first semiconductor chip 210. The sixth semiconductor chip 220 may be disposed at a side of the first semiconductor chip 210 opposite to the first interposing bridge 230. The sixth semiconductor chip 220 may be disposed to be laterally spaced apart from a second edge 212 of the first semiconductor chip 210. The second edge 212 of the first semiconductor chip 210 may be located to be opposite to the first edge 211 of the first semiconductor chip 210.

The first interposing bridge 230 may be a vertical connection member that electrically and vertically connects the interconnection layer 100 to the second sub-package 300. The first interposing bridge 230 may include a first layer of through vias 231, 232, 233, and 234 disposed at a first level. The first layer of through vias 231, 232, 233, and 234 may correspond to through silicon vias (TSVs) vertically penetrating a body of the first interposing bridge 230. The first layer of through vias 231, 232, 233, and 234 of the first interposing bridge 230 may be formed to include a conductive material such as a metal material, for example, a copper material. Because the first layer of through vias 231, 232, 233, and 234 are formed of TSVs, it may be possible to maximize the number of the through vias 231, 232, 233, and 234 disposed in a limited area. A body of the first interposing bridge 230 may be a silicon die or a silicon chip.

A distance between the first semiconductor chip 210 and the first through via 231 of the first layer of through vias 231, 232, 233, and 234 may be less than a distance between the first semiconductor chip 210 and the second through vias 232 of the first layer of through vias 231, 232, 233, and 234. A distance between the first semiconductor chip 210 and the third through via 233 of the first layer of through vias 231, 232, 233, and 234 may be greater than a distance between the first semiconductor chip 210 and the second through vias 232 of the first layer of through vias 231, 232, 233, and 234. A distance between the first semiconductor chip 210 and the fourth through vias 234 of the first layer of through vias 231, 232, 233, and 234 may be greater than a distance between the first semiconductor chip 210 and the third through vias 233 of the first layer of through vias 231, 232, 233, and 234.

The first encapsulant 250 may be disposed to partially cover the first semiconductor chip 210, the sixth semiconductor chip 220, and the first interposing bridge 230. As illustrated in FIG. 3, the first encapsulant 250 may be disposed to expose a top surface 230T of the first interposing bridge 230. Thus, the first layer of through vias 231, 232, 233, and 234 may be revealed by the first encapsulant 250. The first encapsulant 250 may also be disposed to expose a top surface 210T of the first semiconductor chip 210 and a top surface 220T of the sixth semiconductor chip 220. In an embodiment, although not shown in the drawings, the first encapsulant 250 may extend to cover the top surface 210T of the first semiconductor chip 210 and the top surface 220T of the sixth semiconductor chip 220.

The first encapsulant 250 may be disposed to fill gap regions between the first semiconductor chip 210, the sixth semiconductor chip 220, and the first interposing bridge 230. The first encapsulant 250 may be disposed to provide a body shape of the first sub-package 200. The first encapsulant 250 may be formed to include at least one of various encapsulant materials. The first encapsulant 250 may be formed by molding an EMC material.

Referring again to FIGS. 1 and 3, the first layer of through vias 231, 232, 233, and 234 may be disposed to be electrically insulated from each other. The interconnection layer 100 may be configured to include a dielectric layer 110 and conductive interconnection patterns 120 disposed in the dielectric layer 110. The dielectric layer 110 may be formed to include at least one of various dielectric materials. The dielectric layer 110 may be formed to include a plurality of dielectric layers which are stacked. The interconnection layer 100 may be formed to include a plurality of redistributed lines using a redistribution process while a packaging process is performed.

First, second, fourth, and fifth horizontal interconnection patterns 121, 122, 123, and 124 may be disposed in the dielectric layer 110. The first horizontal interconnection patterns 121 may be conductive patterns for electrically connecting the first through vias 231 to the first semiconductor chip 210. The second horizontal interconnection patterns 122 may be conductive patterns for electrically connecting the second through vias 232 to the first semiconductor chip 210. The fourth horizontal interconnection patterns 123 may be conductive patterns for electrically connecting the third through vias 233 to the first semiconductor chip 210. The fifth horizontal interconnection patterns 124 may be conductive patterns for electrically connecting the fourth through vias 234 to the first semiconductor chip 210. The first, second, fourth, and fifth horizontal interconnection patterns 121, 122, 123, and 124 may provide independent paths for electrically connecting the first to fourth through vias 231, 232, 233, and 234 to the first semiconductor chip 210.

Outer connectors 130 may be attached to the interconnection layer 100. The outer connectors 130 may be electrical connection members for connecting the semiconductor package 10 to an external device or an external system. The outer connectors 130 may be, for example, solder balls. The interconnection layer 100 may further include vertical interconnection patterns 125 that electrically connect the first semiconductor chip 210 to the outer connectors 130. The interconnection layer 100 may further include third horizontal interconnection patterns 126 that electrically connect the first semiconductor chip 210 to the sixth semiconductor chip 220.

In an embodiment, the interconnection layer 100 may be an interconnection member that electrically connects the first to fifth sub-packages 200, 300, 400, 500, and 600 to an external electronic device, an external module board, or the like. When the interconnection layer 100 is configured to include redistributed lines, the interconnection layer 100 may have a thickness which is less than a thickness of general printed circuit boards (PCBs). Accordingly, it may be possible to reduce a total thickness of the semiconductor package 10.

Figure 4:
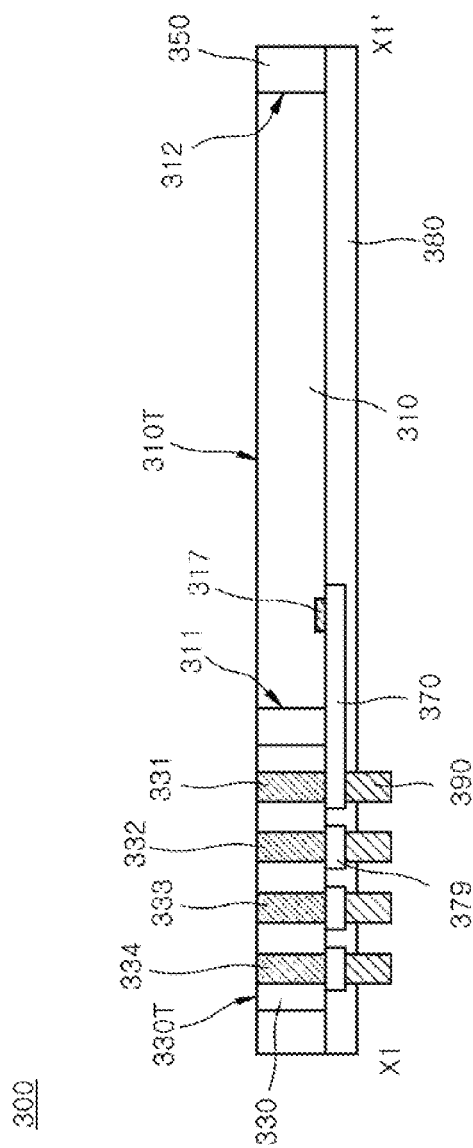
FIGS. 4 to 6 illustrate a second sub-package included in the semiconductor package of FIG. 1.
Figure 5:
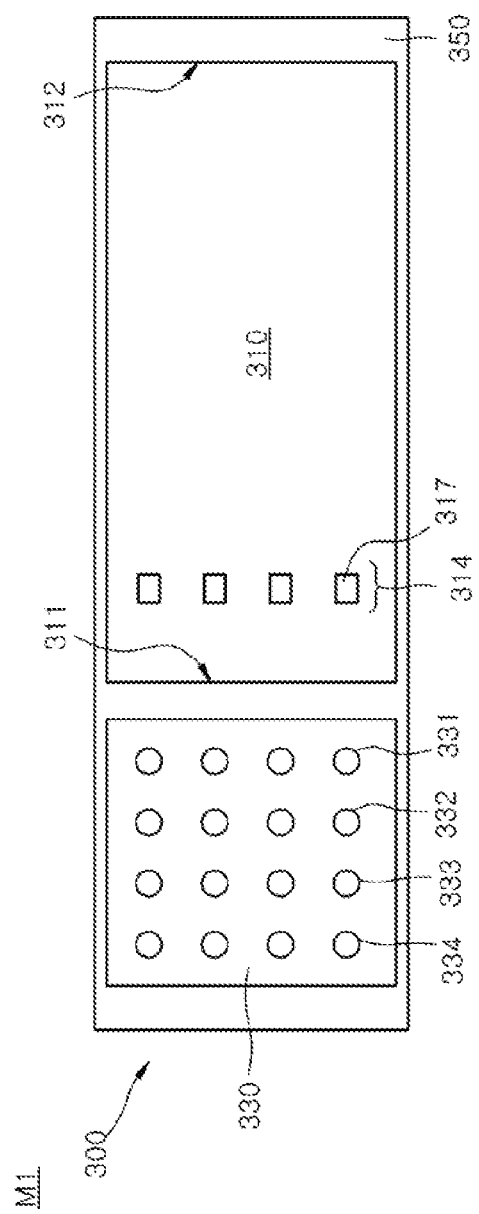
Figure 6:
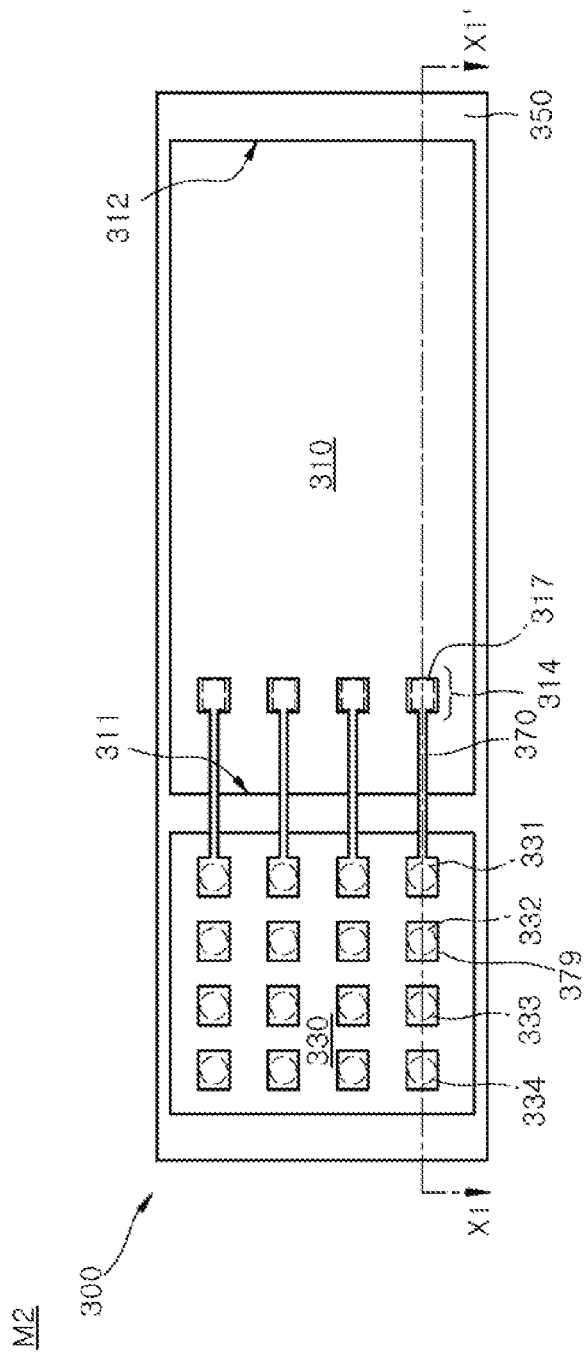

FIG. 4 is a cross-sectional view illustrating the second sub-package 300 included in the semiconductor package 10 of FIG. 1. FIG. 5 is a plan view illustrating a layout M1 of a second semiconductor chip 310 and the second interposing bridge 330 included in the second sub-package 300 of FIG. 4. FIG. 6 is a plan view illustrating a layout M2 of first redistributed lines 370 included in the second sub-package 300 of FIG. 4. FIG. 4 is a cross-sectional view taken along a line X1-X1' of FIG. 6.

Referring to FIGS. 1 and 4, the second sub-package 300 may be configured to include the second semiconductor chip 310, the second interposing bridge 330, and a second encapsulant 350. The second semiconductor chip 310 may act as a storage chip storing data calculated by the first semiconductor chip 210. The first semiconductor chip 210 may be configured to include a process chip, and the second semiconductor chip 310 may be configured to include a DRAM device.

The second interposing bridge 330 may be disposed to be laterally spaced from a first edge 311 of the second semiconductor chip 310. The second interposing bridge 330 may be a vertical connection member that electrically and vertically connects the third sub-package 400 of FIG. 1 to the first interposing bridge 230 of the first sub-package 200 of FIG. 1. The second interposing bridge 330 may include a second layer of through vias 331, 332, 333, and 334 disposed at a second level. The second layer of through vias 331, 332, 333, and 334 may correspond to through silicon vias (TSVs) vertically penetrating a body of the second interposing bridge 330.

Referring to FIGS. 4 and 5, in the second interposing bridge 330, a distance between the second semiconductor chip 310 and the first through vias 331 of the second layer of through vias 331, 332, 333, and 334 may be less than a distance between the second semiconductor chip 310 and the second through vias 332 of the second layer of through vias 331, 332, 333, and 334. The first through vias 331 of the second layer of through vias 331, 332, 333, and 334 may be arrayed in a first column facing a first edge 311 of the second semiconductor chip 310. The second through vias 332 of the second layer of through vias 331, 332, 333, and 334 may be arrayed in a second column which is located at a side of the first column opposite to the second semiconductor chip 310. The third through vias 333 of the second layer of through vias 331, 332, 333, and 334 may be arrayed in a third column, and the fourth through vias 334 of the second layer of through vias 331, 332, 333, and 334 may be arrayed in a fourth column. A distance between the second semiconductor chip 310 and the third through vias 333 of the second layer of through vias 331, 332, 333, and 334 may be greater than a distance between the second semiconductor chip 310 and the second through vias 332 of the second layer of through vias 331, 332, 333, and 334. A distance between the second semiconductor chip 310 and the fourth through vias 334 of the second layer of through vias 331, 332, 333, and 334 may be greater than a distance between the second semiconductor chip 310 and the third through vias 333 of the second layer of through vias 331, 332, 333, and 334.

Referring to FIG. 4, the second encapsulant 350 of the second sub-package 300 may be disposed to partially cover the second semiconductor chip 310 and the second interposing bridge 330. The second encapsulant 350 may be disposed to expose a top surface 330T of the second interposing bridge 330 and a top surface 310T of the second semiconductor chip 310. In an embodiment, although not shown in the drawings, the second encapsulant 350 may extend to cover the top surface 310T of the second semiconductor chip 310. The second encapsulant 350 may be disposed to fill a gap region between the second semiconductor chip 310 and the second interposing bridge 330. The second encapsulant 350 may be disposed to provide a body shape of the second sub-package 300. The second encapsulant 350 may be formed to include at least one of various encapsulant materials. The second encapsulant 350 may be formed by molding an EMC material.

Referring to FIGS. 4, 5, and 6, the second sub-package 300 may further include the first redistributed lines 370. The first redistributed lines 370 may be conductive patterns for connecting the second semiconductor chip 310 to the first through vias 331 of the second layer of through vias 331, 332, 333, and 334. The first redistributed lines 370 may extend such that first portions of the first redistributed lines 370 overlaps with respective chip pads of chip pads 317 of the second semiconductor chip 310 and second portions of the first redistributed lines 370 overlaps with respective through vias of the first through vias 331. Accordingly, the first redistributed lines 370 may electrically connect the second semiconductor chip 310 to the first through vias 331 of the second layer of through vias 331, 332, 333, and 334. The first redistributed lines 370 may extend to pass over a surface of the second encapsulant 350 filling the gap region between the second semiconductor chip 310 and the second interposing bridge 330 and may reach and contact the first through vias 331.

The second, third, and fourth through vias 332, 333, and 334 among the second layer of through vias 331, 332, 333, and 334 may be disconnected from the first redistributed lines 370 to be electrically isolated from the second semiconductor chip 310. When the first redistributed lines 370 are formed, via pads 379 may also be formed to overlap with respective through vias of the second, third, and fourth through vias 332, 333, and 334 among the second layer of through vias 331, 332, 333, and 334.

Referring to FIGS. 5 and 6, the chip pads 317 of the second semiconductor chip 310 may be arrayed in some columns in a plan view. A pad region 314 of the second semiconductor chip 310 may be defined as a region between the first edge 311 of the second semiconductor chip 310 facing the second interposing bridge 330 and a second edge 312 of the second semiconductor chip 310 opposite to the second interposing bridge 330. The pad region 314 of the second semiconductor chip 310 may be defined such that a distance between the pad region 314 and the first edge 311 is less than a distance between the pad region 314 and the second edge 312.

Because the chip pads 317 are disposed on the pad region 314 of the second semiconductor chip 310, a distance between the first edge 311 and the chip pads 317 may be less than a distance between the second edge 312 and the chip pads 317. Thus, it may be possible to reduce a distance between the chip pads 317 of the second semiconductor chip 310 and the first through vias 331 of the second interposing bridge 330. If the distance between the chip pads 317 of the second semiconductor chip 310 and the first through vias 331 of the second interposing bridge 330 is reduced, a length of the first redistributed lines 370 may be reduced to lower an electrical resistance value of the first redistributed lines 370.

Referring again to FIGS. 1 and 4, the second sub-package 300 may be vertically stacked on the first sub-package 200 such that the second layer of through vias 331, 332, 333, and 334 overlap with respective through vias of the first layer of through vias 231, 232, 233, and 234. The second layer of through vias 331, 332, 333, and 334 may be electrically connected to the respective through vias of the first layer of through vias 231, 232, 233, and 234 by first inner connectors 390. The first inner connectors 390 may be connection members such as conductive bumps. The first inner connectors 390 may penetrate a dielectric layer 380 covering the first redistributed lines 370 to electrically isolate the first redistributed lines 370 from each other and may be electrically connected to respective via pads of the via pads 379 overlapping with the second, third, and fourth through vias 332, 333, and 334 and the first redistributed lines 370 overlapping with the first through vias 331.

The second semiconductor chip 310 may be electrically connected to the first semiconductor chip 210 through electrical paths that are comprised of the first redistributed lines 370, the first inner connectors 390, the first through vias 231 of the first layer of through vias, and the first horizontal interconnection patterns 121. That is, the first semiconductor chip 210 and the second semiconductor chip 310 may independently communicate with each other through the electrical paths that are comprised of the first redistributed lines 370, the first inner connectors 390, the first through vias 231 of the first layer of through vias, and the first horizontal interconnection patterns 121 regardless of the third to fifth sub-packages 400, 500, and 600.

Figure 7:
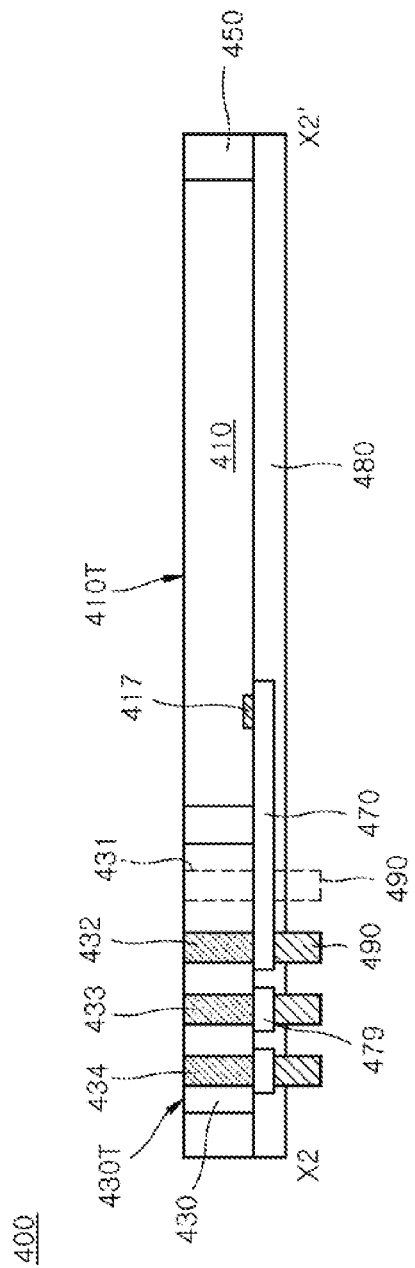
FIGS. 7 and 8 illustrate a third sub-package included in the semiconductor package of FIG. 1.
Figure 8:
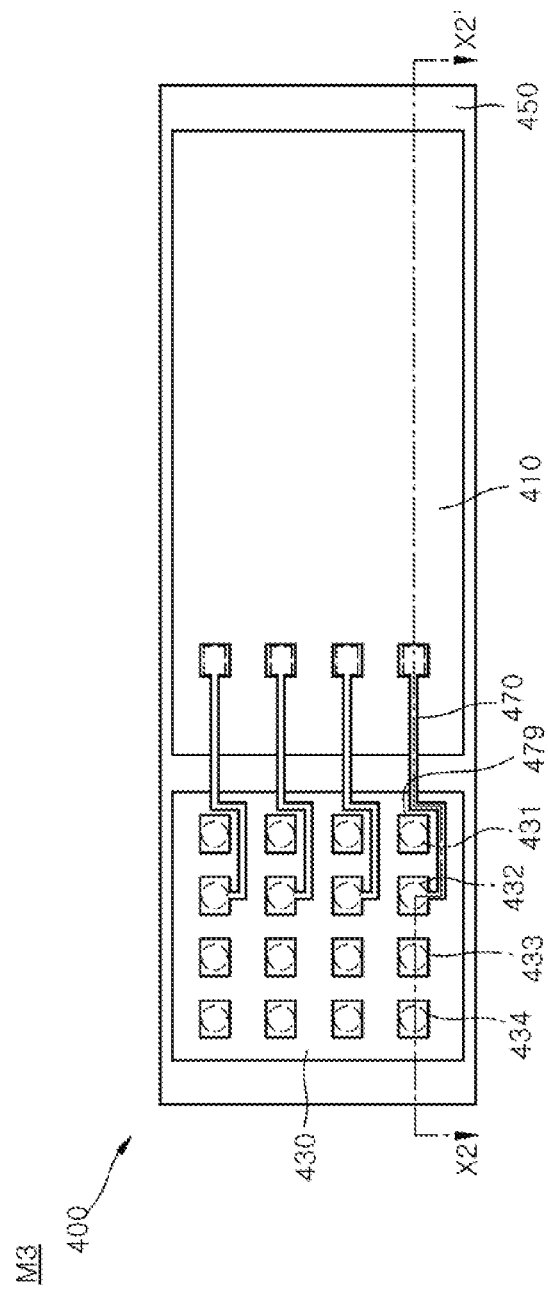

FIG. 7 is a cross-sectional view illustrating the third sub-package 400 shown in FIG. 1. FIG. 8 is a plan view illustrating a layout M3 of second redistributed lines 470 included in the third sub-package 400 of FIG. 7. FIG. 7 is a cross-sectional view taken along a line X2-X2' of FIG. 8.

Referring to FIGS. 1 and 7, the third sub-package 400 may be configured to include a third semiconductor chip 410, the third interposing bridge 430, and a third encapsulant 450. The third semiconductor chip 410 may act as a storage chip storing data calculated by the first semiconductor chip 210.

The third interposing bridge 430 may be disposed to be laterally spaced from the third semiconductor chip 410. The third interposing bridge 430 may be a vertical connection member that electrically and vertically connects the fourth sub-package 500 of FIG. 1 to the second interposing bridge 330 of the second sub-package 30 of FIG. 1. The third interposing bridge 430 may include a third layer of through vias 431, 432, 433, and 434 disposed at a third level.

A distance between the third semiconductor chip 410 and the first through vias 431 of the third layer of through vias 431, 432, 433, and 434 may be less than a distance between the third semiconductor chip 410 and the second through vias 432 of the third layer of through vias 431, 432, 433, and 434. A distance between the third semiconductor chip 410 and the third through vias 433 of the third layer of through vias 431, 432, 433, and 434 may be greater than a distance between the third semiconductor chip 410 and the second through vias 432 of the third layer of through vias 431, 432, 433, and 434. A distance between the third semiconductor chip 410 and the fourth through vias 434 of the third layer of through vias 431, 432, 433, and 434 may be greater than a distance between the third semiconductor chip 410 and the third through vias 433 of the third layer of through vias 431, 432, 433, and 434.

Referring to FIG. 7, the third encapsulant 450 of the third sub-package 400 may be disposed to partially cover the third semiconductor chip 410 and the third interposing bridge 430. The third encapsulant 450 may be disposed to expose a top surface 430T of the third interposing bridge 430 and a top surface 410T of the third semiconductor chip 410. In an embodiment, although not shown in the drawings, the third encapsulant 450 may extend to cover the top surface 410T of the third semiconductor chip 410. The third encapsulant 450 may be disposed to fill a gap region between the third semiconductor chip 410 and the third interposing bridge 430.

Referring to FIGS. 1, 7, and 8, the third sub-package 400 may further include the second redistributed lines 470. The second redistributed lines 470 may be conductive patterns for connecting the third semiconductor chip 410 to the second through vias 432 of the third layer of through vias 431, 432, 433, and 434. The second redistributed lines 470 may extend such that first portions of the second redistributed lines 470 overlaps with respective chip pads of chip pads 417 of the third semiconductor chip 410 and second portions of the second redistributed lines 470 overlaps with respective through vias of the second through vias 432. Accordingly, the second redistributed lines 470 may electrically connect the third semiconductor chip 410 to the second through vias 432 of the third layer of through vias 431, 432, 433, and 434. The second redistributed lines 470 may extend to pass over a surface of the third encapsulant 450 filling the gap region between the third semiconductor chip 410 and the third interposing bridge 430 and may reach and contact the second through vias 432. The second redistributed lines 470 may be disposed to detour the first through vias 431 to be electrically disconnected from the first through vias 431.

The first, third, and fourth through vias 431, 433, and 434 among the third layer of through vias 431, 432, 433, and 434 may be disconnected from the second redistributed lines 470 to be electrically isolated from the third semiconductor chip 410. When the second redistributed lines 470 are formed, via pads 479 may also be formed to overlap with respective through vias of the first, third, and fourth through vias 431, 433, and 434 among the third layer of through vias 431, 432, 433, and 434.

Referring again to FIGS. 1 and 7, the third sub-package 400 may be vertically stacked on the second sub-package 300 such that the third layer of through vias 431, 432, 433, and 434 overlap with respective through vias of the second layer of through vias 331, 332, 333, and 334. The third layer of through vias 431, 432, 433, and 434 may be electrically connected to the respective through vias of the second layer of through vias 331, 332, 333, and 334 by second inner connectors 490. The second inner connectors 490 may penetrate a dielectric layer 480 covering the second redistributed lines 470 to electrically isolate the second redistributed lines 470 from each other and may be electrically connected to respective via pads of the via pads 479 overlapping with the first, third, and fourth through vias 431, 433, and 434 and the second redistributed lines 470 overlapping with the second through vias 432.

Referring again to FIG. 2, the third semiconductor chip 410 may be electrically connected to the first semiconductor chip 210 through electrical paths that are comprised of the second redistributed lines 470, the second inner connectors 490, the second through vias 332 of the second layer of through vias, the first inner connectors 390, the second through vias 232 of the first layer of through vias, and the second horizontal interconnection patterns 122. That is, the first semiconductor chip 210 and the third semiconductor chip 410 may independently communicate with each other through the electrical paths that are comprised of the second redistributed lines 470, the second inner connectors 490, the second through vias 332 of the second layer of through vias, the first inner connectors 390, the second through vias 232 of the first layer of through vias, and the second horizontal interconnection patterns 122 regardless of the second, fourth, and fifth sub-packages 300, 500, and 600. Although the first through vias 431 of the third layer of through vias are electrically connected to the first through vias 331 of the second layer of through vias, the first through vias 431 of the third layer of through vias may be electrically disconnected from the third semiconductor chip 410. Because the first through vias 431 of the third layer of through vias are electrically isolated or insulated from the third semiconductor chip 410, the first through vias 431 of the third layer of through vias may be regarded as dummy vias of the third interposing bridge 430.

Figure 9:
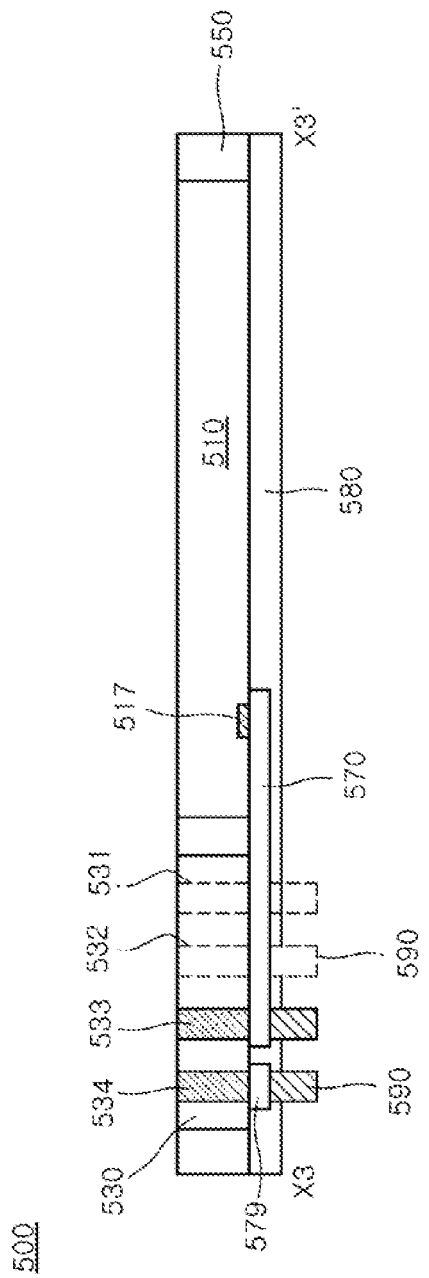
FIGS. 9 and 10 illustrate a fourth sub-package included in the semiconductor package of FIG. 1.
Figure 10:
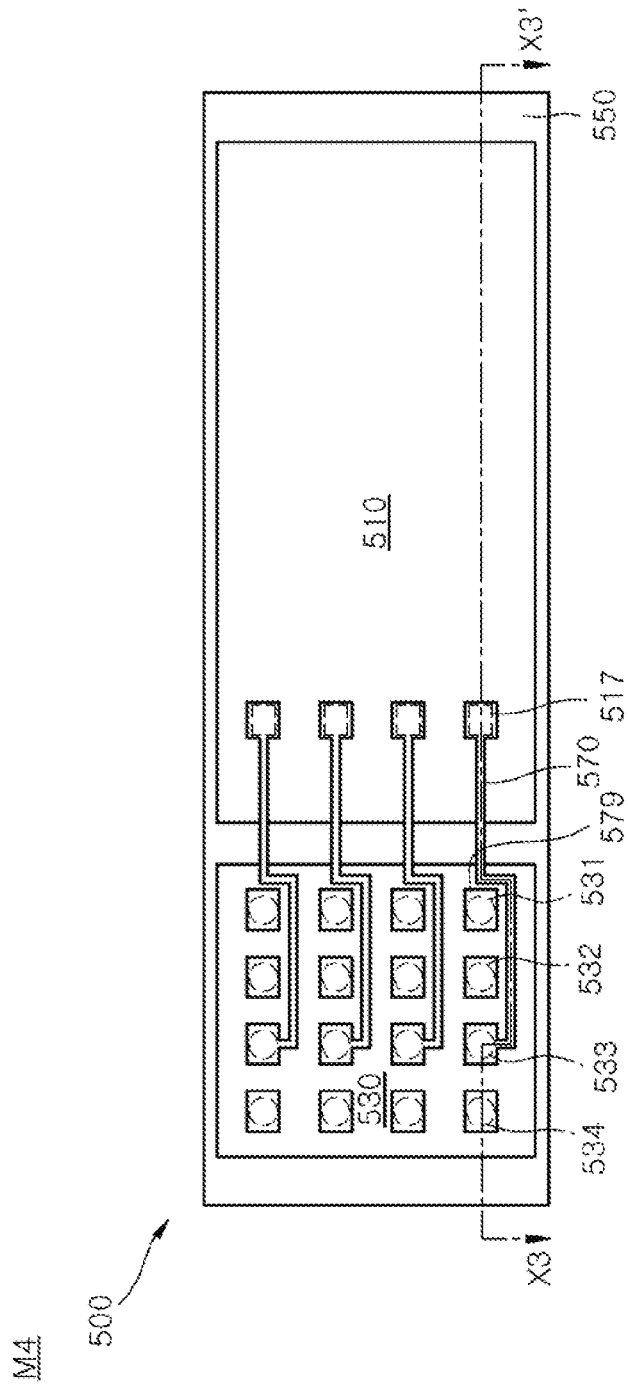

FIG. 9 is a cross-sectional view illustrating the fourth sub-package 500 shown in FIG. 1. FIG. 10 is a plan view illustrating a layout M4 of third redistributed lines 570 included in the fourth sub-package 500 of FIG. 9. FIG. 9 is a cross-sectional view taken along a line X3-X3' of FIG. 10.

Referring to FIGS. 1 and 9, the fourth sub-package 500 may be configured to include a fourth semiconductor chip 510, the fourth interposing bridge 530, and a fourth encapsulant 550. The fourth semiconductor chip 510 may act as a storage chip storing data calculated by the first semiconductor chip 210.

The fourth interposing bridge 530 may be disposed to be laterally spaced from the fourth semiconductor chip 510. The fourth interposing bridge 530 may be a vertical connection member that electrically and vertically connects the fifth sub-package 600 of FIG. 1 to the third interposing bridge 430 of the third sub-package 400 of FIG. 1. The fourth interposing bridge 530 may include a fourth layer of through vias 531, 532, 533, and 534 disposed at a fourth level.

Referring to FIGS. 1, 2, 9, and 10, the fourth sub-package 500 may further include the third redistributed lines 570. The third redistributed lines 570 may be conductive patterns for connecting the fourth semiconductor chip 510 to the third through vias 533 of the fourth layer of through vias 531, 532, 533, and 534. The third redistributed lines 570 may extend such that first portions of the third redistributed lines 570 overlaps with respective chip pads of chip pads 517 of the fourth semiconductor chip 510 and second portions of the third redistributed lines 570 overlaps with respective through vias of the third through vias 533. Accordingly, the third redistributed lines 570 may electrically connect the fourth semiconductor chip 510 to the third through vias 533 of the fourth layer of through vias 531, 532, 533, and 534. The third redistributed lines 570 may be disposed to detour the first and second through vias 531 and 532 to be electrically disconnected from the first and second through vias 531 and 532.

The first, second, and fourth through vias 531, 532, and 534 among the third layer of through vias 531, 532, 533, and 534 may be disconnected from the third redistributed lines 570 to be electrically isolated from the fourth semiconductor chip 510. When the third redistributed lines 570 are formed, via pads 579 may also be formed to overlap with respective through vias of the first, second, and fourth through vias 531, 532, and 534 among the fourth layer of through vias 531, 532, 533, and 534.

Referring again to FIGS. 1 and 9, the fourth sub-package 500 may be vertically stacked on the third sub-package 400 such that the fourth layer of through vias 531, 532, 533, and 534 overlap with respective through vias of the third layer of through vias 431, 432, 433, and 434. The fourth layer of through vias 531, 532, 533, and 534 may be electrically connected to the respective through vias of the third layer of through vias 431, 432, 433, and 434 by third inner connectors 590. The third inner connectors 590 may penetrate a dielectric layer 580 covering the third redistributed lines 570 to electrically isolate the third redistributed lines 570 from each other and may be electrically connected to respective via pads of the via pads 579 overlapping with the first, second, and fourth through vias 531, 532, and 534 and the third redistributed lines 570 overlapping with the third through vias 533.

Referring again to FIG. 2, the fourth semiconductor chip 510 may be electrically connected to the first semiconductor chip 210 through electrical paths that are comprised of the third redistributed lines 570, the third inner connectors 590, the third through vias 433 of the third layer of through vias, the second inner connectors 490, the third through vias 333 of the second layer of through vias, the first inner connectors 390, the third through vias 233 of the first layer of through vias, and the fourth horizontal interconnection patterns 123. That is, the first semiconductor chip 210 and the fourth semiconductor chip 510 may independently communicate with each other through the electrical paths that are comprised of the third redistributed lines 570, the third inner connectors 590, the third through vias 433 of the third layer of through vias, the second inner connectors 490, the third through vias 333 of the second layer of through vias, the first inner connectors 390, the third through vias 233 of the first layer of through vias, and the fourth horizontal interconnection patterns 123 regardless of the second, third, and fifth sub-packages 300, 400, and 600. Although the first and second through vias 531 and 532 of the fourth layer of through vias are electrically connected to the first and second through vias 431 and 432 of the third layer of through vias, the first and second through vias 531 and 532 of the fourth layer of through vias may be electrically disconnected from the fourth semiconductor chip 510. Because the first and second through vias 531 and 532 of the fourth layer of through vias are electrically isolated or insulated from the fourth semiconductor chip 510, the first and second through vias 531 and 532 of the fourth layer of through vias may be regarded as dummy vias of the fourth interposing bridge 530.

Figure 11:
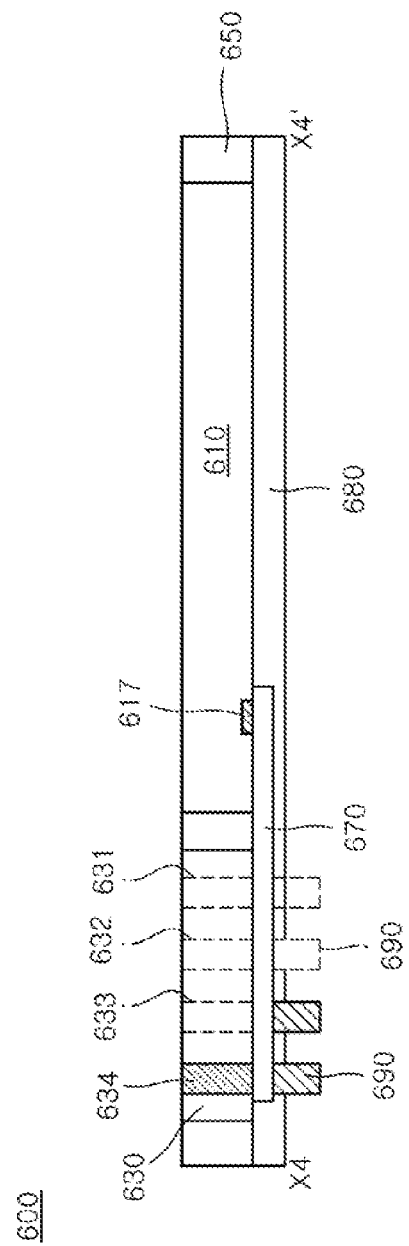
FIGS. 11 and 12 illustrate a fifth sub-package included in the semiconductor package of FIG. 1.
Figure 12:
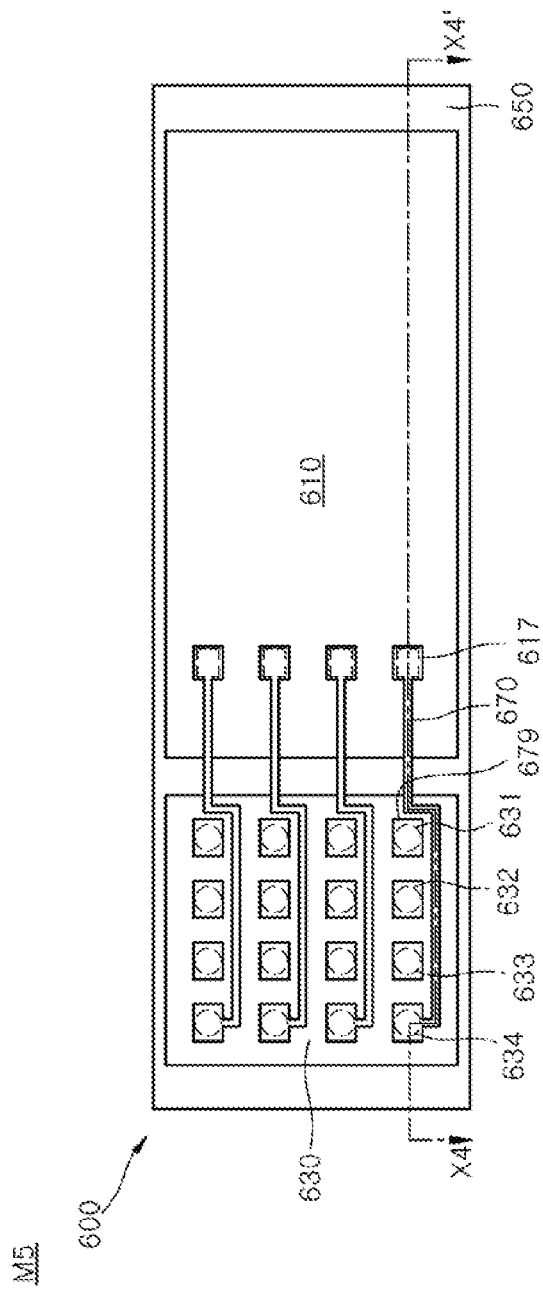

FIG. 11 is a cross-sectional view illustrating the fifth sub-package 600 of FIG. 1. FIG. 12 is a plan view illustrating a layout M5 of fourth redistributed lines 670 included in the fifth sub-package 600 of FIG. 11. FIG. 11 is a cross-sectional view taken along a line X4-X4' of FIG. 12.

Referring to FIGS. 1 and 11, the fifth sub-package 600 may be configured to include a fifth semiconductor chip 610, the fifth interposing bridge 630, and a fifth encapsulant 650. The fifth semiconductor chip 610 may act as a storage chip storing data calculated by the first semiconductor chip 210.

The fifth interposing bridge 630 may be disposed to be laterally spaced from the fifth semiconductor chip 610. The fifth interposing bridge 630 may include a fifth layer of through vias 631, 632, 633, and 634 disposed at a fifth level.

Referring to FIGS. 1, 11, and 12, the fifth sub-package 600 may further include the fourth redistributed lines 670. The fourth redistributed lines 570 may be conductive patterns for connecting the fifth semiconductor chip 610 to the fourth through vias 634 of the fifth layer of through vias 631, 632, 633, and 634. The fourth redistributed lines 670 may extend such that first portions of the fourth redistributed lines 670 overlaps with respective chip pads of chip pads 617 of the fifth semiconductor chip 610 and second portions of the fourth redistributed lines 670 overlaps with respective through vias of the fourth through vias 634. Accordingly, the fourth redistributed lines 670 may electrically connect the fifth semiconductor chip 610 to the fourth through vias 634 of the fifth layer of through vias 631, 632, 633, and 634. The fourth redistributed lines 670 may be disposed to detour the first to third through vias 631, 632, and 633 to be electrically disconnected from the first to third through vias 631, 632, and 633.

The first, second, and third through vias 631, 632, and 633 among the fourth layer of through vias 631, 632, 633, and 634 may be disconnected from the fourth redistributed lines 670 to be electrically isolated from the fifth semiconductor chip 610. When the fourth redistributed lines 670 are formed, via pads 679 may also be formed to overlap with respective through vias of the first, second, and third through vias 631, 632, and 633 among the fifth layer of through vias 631, 632, 633, and 634.

Referring again to FIGS. 1, 11, and 12, the fifth sub-package 600 may be vertically stacked on the fourth sub-package 500 such that the fifth layer of through vias 631, 632, 633, and 634 overlap with respective through vias of the fourth layer of through vias 531, 532, 533, and 534. The fifth sub-package 600 may be vertically stacked on the fourth sub-package 500 such that the fifth interposing bridge 630 overlaps with and are aligned with the fourth interposing bridge 530. The first to fifth sub-packages 200, 300, 400, 500, and 600 may be vertically stacked on the interconnection layer 100 such that the first to fifth interposing bridges 230, 330, 430, 530, and 630 overlap with each other and are aligned with each other.

The fifth layer of through vias 631, 632, 633, and 634 may be electrically connected to respective through vias of the fourth layer of through vias 531, 532, 533, and 534 by fourth inner connectors 690. The fourth inner connectors 690 may penetrate a dielectric layer 680 covering the fourth redistributed lines 670 to electrically isolate the fourth redistributed lines 670 from each other and may be electrically connected to respective via pads of the via pads 679 overlapping with the first, second, and third through vias 631, 632, and 633 and the fourth redistributed lines 670 overlapping with the fourth through vias 634.

Referring again to FIG. 2, the fifth semiconductor chip 610 may be electrically connected to the first semiconductor chip 210 through electrical paths that are comprised of the fourth redistributed lines 670, the fourth inner connectors 690, the fourth through vias 534 of the fourth layer of through vias, the third inner connectors 590, the fourth through vias 434 of the third layer of through vias, the second inner connectors 490, the fourth through vias 334 of the second layer of through vias, the first inner connectors 390, the fourth through vias 234 of the first layer of through vias, and the fifth horizontal interconnection patterns 124. That is, the first semiconductor chip 210 and the fifth semiconductor chip 610 may independently communicate with each other through the electrical paths that are comprised of the fourth redistributed lines 670, the fourth inner connectors 690, the fourth through vias 534 of the fourth layer of through vias, the third inner connectors 590, the fourth through vias 434 of the third layer of through vias, the second inner connectors 490, the fourth through vias 334 of the second layer of through vias, the first inner connectors 390, the fourth through vias 234 of the first layer of through vias, and the fifth horizontal interconnection patterns 124 regardless of the second, third, and fourth sub-packages 300, 400, and 500 regardless of the second, third, and fourth sub-packages 300, 400, and 500.

Although the first, second, and third through vias 631, 632, and 633 of the fifth layer of through vias are electrically connected to the first, second, and third through vias 531, 532, and 533 of the fourth layer of through vias, the first, second, and third through vias 631, 632, and 633 of the fifth layer of through vias may be electrically disconnected from the fifth semiconductor chip 610. Because the first, second and third through vias 631, 632, and 633 of the fifth layer of through vias are electrically isolated or insulated from the fifth semiconductor chip 610, the first, second and third through vias 631, 632, and 633 of the fifth layer of through vias may be regarded as dummy vias of the fifth interposing bridge 630.

Figure 13:
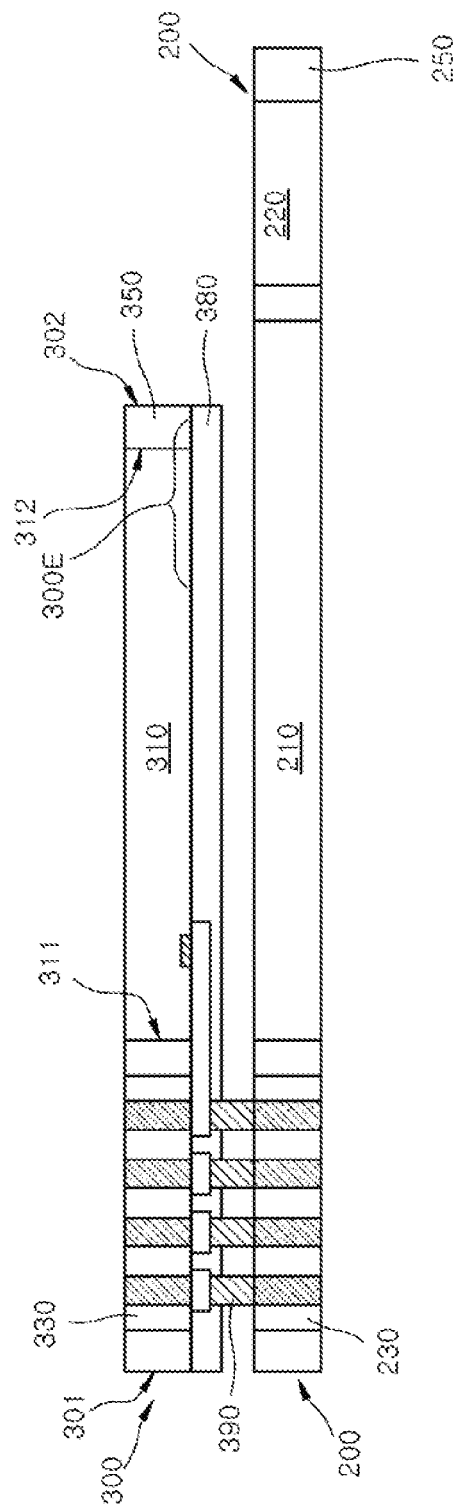
FIGS. 13 and 14 are cross-sectional views illustrating supporters disposed between sub-packages of the semiconductor package of FIG. 1.
Figure 14:
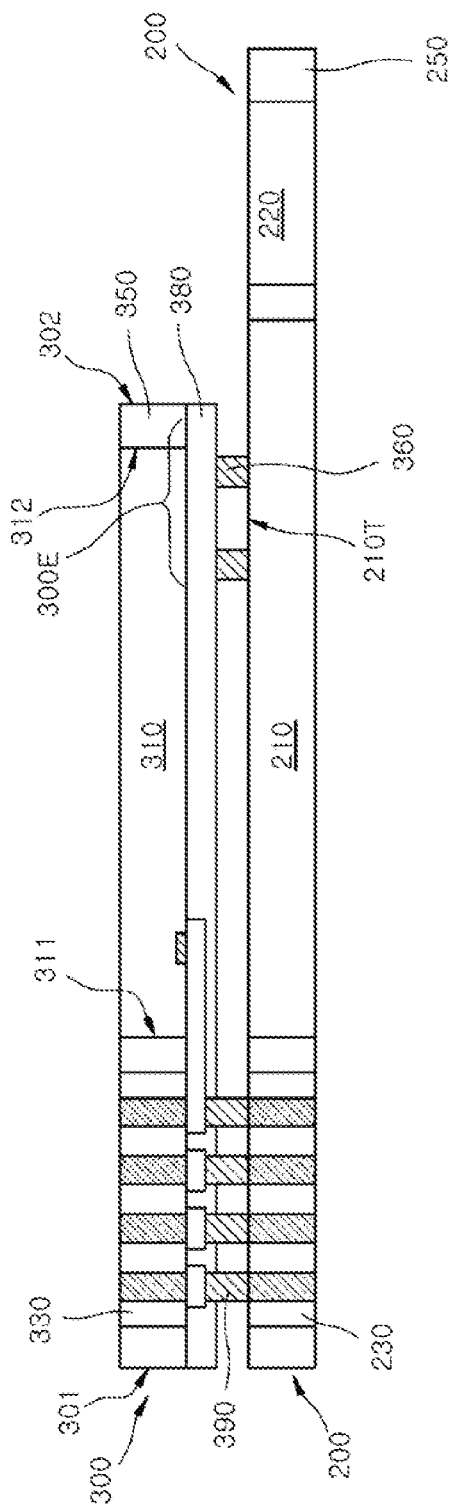

FIGS. 13 and 14 are cross-sectional views illustrating supporters 360 disposed between the first sub-package 200 and the second sub-package 300 shown in FIG. 1.

Referring to FIG. 13, the first inner connectors 390 may be disposed between the second interposing bridge 330 of the second sub-package 300 and the first interposing bridge 230 of the first sub-package 200 to electrically connect the second interposing bridge 330 to the first interposing bridge 230. In such a case, the second interposing bridge 330 of the second sub-package 300 may be disposed to face the first edge 311 of the second semiconductor chip 310. No interposing bridge may be disposed at a side of the second semiconductor chip 310 opposite to the first interposing bridge 230. That is, there may be no interposing bridge facing the second edge 312 of the second semiconductor chip 310. Thus, the first inner connectors 390 may be disposed to be adjacent to a first edge 301 of the second sub-package 300 close to the second interposing bridge 330, thereby overlapping with the second interposing bridge 330. Accordingly, no inner connector is disposed under a region 300E which is adjacent to a second edge 302 of the second sub-package 300 opposite to the first edge 301. Thus, the region 300E adjacent to the second edge 302 of the second sub-package 300 is not supported by the first inner connectors 390.

The supporters 360 may be disposed between the first sub-package 200 and the second sub-package 300 to support the region 300E of the second sub-package 300. The supporters 360 may be disposed under the region 300E of the second sub-package 300 to be laterally spaced apart from the first inner connectors 390. The supporters 360 may be disposed to overlap with the second semiconductor chip 310. The supporters 360 may stably support the second sub-package 300 together with the first inner connectors 390 to prevent the second sub-package 300 from being inclined. These supporters 360 may also be disposed between the second to fifth sub-packages 300, 400, 500, and 600, as illustrated in FIG. 1.

The supporters 360 may be attached to a surface of the dielectric layer 380 of the second sub-package 300 and/or the top surface 210T of the first semiconductor chip 210 of the first sub-package 200. The supporters 360 may be dummy bumps. The supporters 360 may be formed of a metal material. Alternatively, the supporters 360 may be formed of an insulation material such as a polymer material or a resin material.

Figure 15:
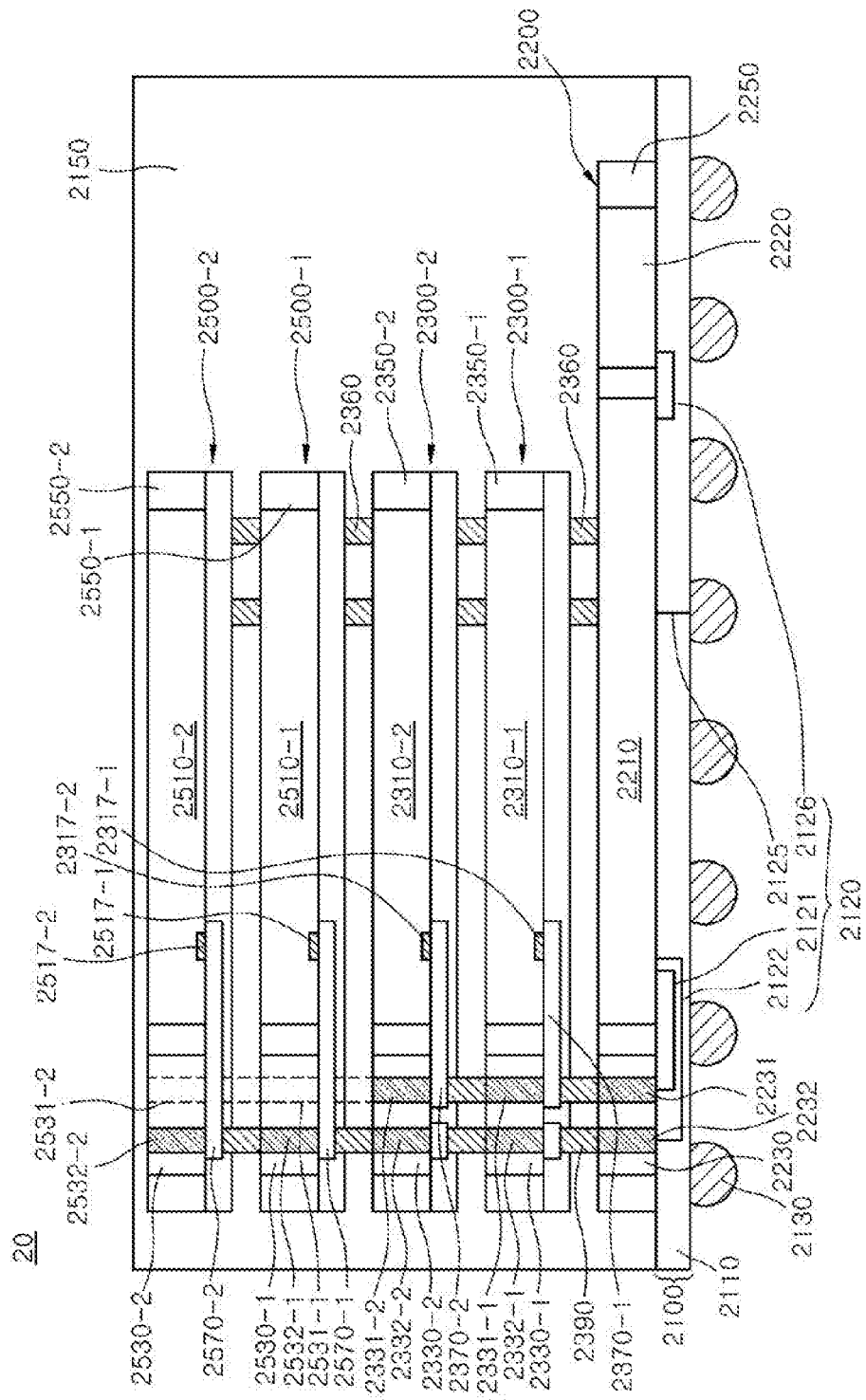
FIG. 15 is a cross-sectional view illustrating a semiconductor package according to another embodiment.

FIG. 15 is a cross-sectional view illustrating a semiconductor package 20 according to another embodiment.

Referring to FIG. 15, the semiconductor package 20 may be configured to include a first sub-package 2200 stacked on an interconnection layer 2100 and second to fifth sub-packages 2300-1, 2300-2, 2500-1, and 2500-2 stacked on the first sub-package 2200. The semiconductor package 20 may further include a sixth encapsulant 2150.

Figure 16:
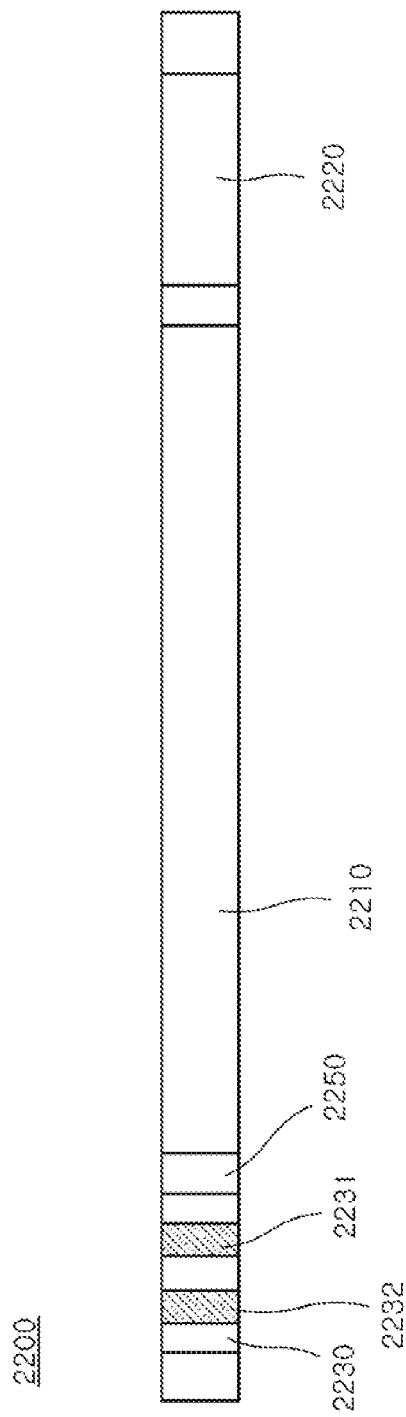
FIG. 16 is a cross-sectional view illustrating a first sub-package included in the semiconductor package of FIG. 15.

FIG. 16 is a cross-sectional view illustrating the first sub-package 2200 shown in FIG. 15.

Referring to FIGS. 15 and 16, the first sub-package 2200 may be configured to include a first semiconductor chip 2210, an auxiliary semiconductor chip 2220 (hereinafter, referred to as a fourth semiconductor chip), a first interposing bridge 2230, and a first encapsulant 2250. The first semiconductor chip 2210 may be a processor chip such as an application processor (AP). The fourth semiconductor chip 2220 may be a buffer memory chip providing a buffer memory used as a cache memory when the semiconductor package 20 or the first semiconductor chip 2210 operates. The first interposing bridge 2230 may be a vertical connection member that electrically and vertically connects the interconnection layer 2100 to the second sub-package 2300-1. The first interposing bridge 2230 may include a first layer of through vias 2231 and 2232 disposed at a first level.

Referring again to FIG. 15, the first layer of through vias 2231 and 2232 may be disposed to be electrically isolated from each other. The interconnection layer 2100 may be configured to include a dielectric layer 2110 and conductive interconnection patterns 2120 disposed in the dielectric layer 2110. First and second horizontal interconnection patterns 2121 and 2122 may be disposed in the dielectric layer 2110. The first horizontal interconnection patterns 2121 may be conductive patterns for electrically connecting the first through vias 2231 of the first layer of through vias 2231 and 2232 to the first semiconductor chip 2210. The second horizontal interconnection patterns 2122 may be conductive patterns for electrically connecting the second through vias 2232 of the first layer of through vias 2231 and 2232 to the first semiconductor chip 2210. The first and second horizontal interconnection patterns 2121 and 2122 may provide independent paths for electrically connecting the first and second through vias 2231 and 2232 to the first semiconductor chip 2210.

Outer connectors 2130 may be attached to the interconnection layer 2100. The interconnection layer 2100 may further include vertical interconnection patterns 2125 that electrically connect the first semiconductor chip 210 to the outer connectors 2130. The interconnection layer 100 may further include third horizontal interconnection patterns 2126 that electrically connect the first semiconductor chip 210 to the fourth semiconductor chip 2220.

Figure 17:
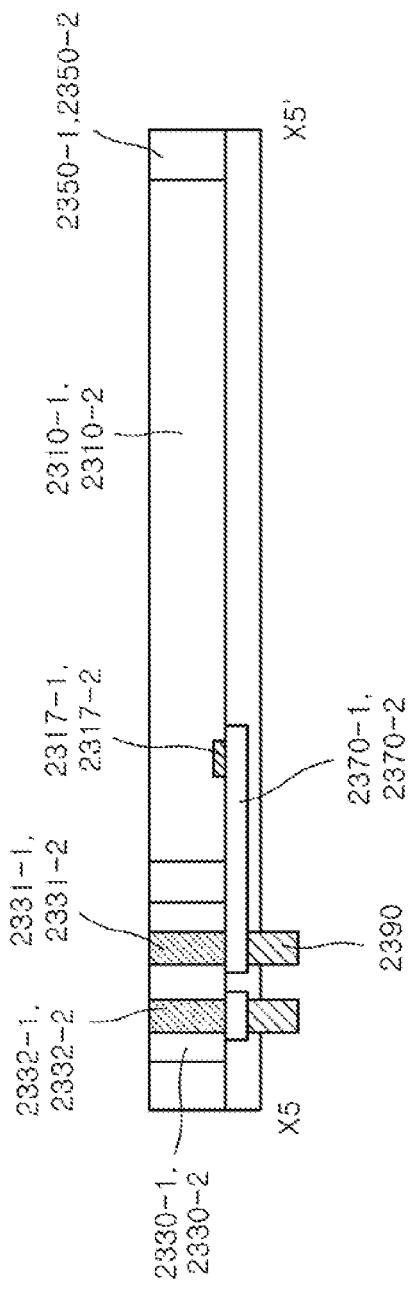
FIGS. 17 and 18 illustrate second and third sub-packages included in the semiconductor package of FIG. 15.
Figure 18:
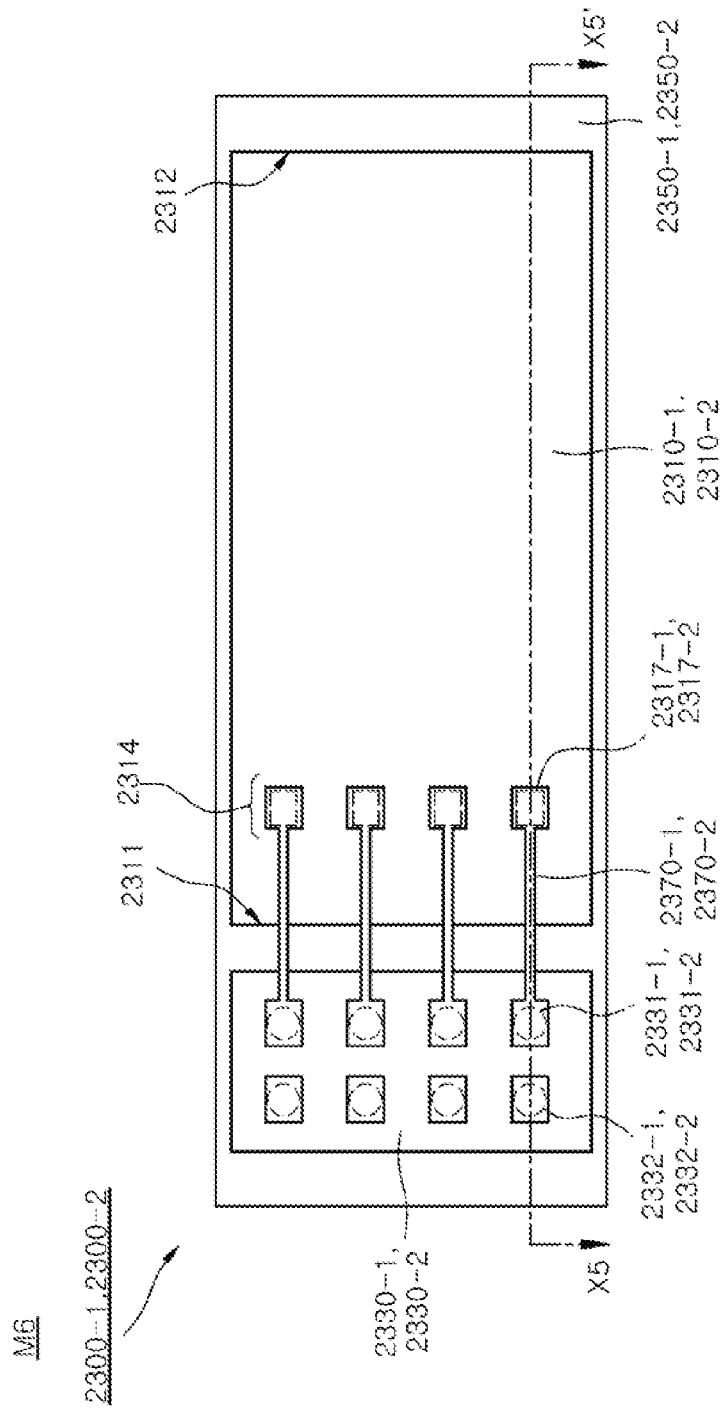

FIG. 17 is a cross-sectional view illustrating the second sub-package 2300-1 shown in FIG. 15. FIG. 18 is a plan view illustrating a layout M6 of first redistributed lines 2370-1 of the second sub-package 2300-1 shown in FIG. 17. FIG. 17 is a cross-sectional view taken along a line X5-X5' of FIG. 18.

Referring to FIGS. 15, 17, and 18, the second sub-package 2300-1 and the third sub-package 2300-2 may have the same configuration. The second sub-package 2300-1 (or the third sub-package 2300-2) may be configured to include a second semiconductor chip 2310-1 (or 2310-2), a second interposing bridge 2330-1 (or 2330-2), and a second encapsulant 2350-1 (or 2350-2). The second semiconductor chip 2310-1 (or 2310-2) may act as a storage chip storing data calculated by the first semiconductor chip 2210.

The second semiconductor chip 2310-1 (or 2310-2) may be a semiconductor chip having substantially the same configuration as the second semiconductor chip 310 described with reference to FIG. 5. The second semiconductor chip 2310-1 (or 2310-2) may have a first edge 2311 facing the second interposing bridge 2330-1 (or 2330-2) and a second edge 2312 which is opposite to the first edge 2311, as illustrated in FIG. 18. The second semiconductor chip 2310-1 (or 2310-2) may be configured to include chip pads 2317-1 (or 2317-2), and the chip pads 2317-1 (or 2317-2) may be arrayed such that a distance between the first edge 2311 and the chip pads 2317-1 (or 2317-2) is less than a distance between the second edge 2312 and the chip pads 2317-1 (or 2317-2).

The second interposing bridge 2330-1 (or 2330-2) may include a second layer of through vias 2331-1 (or 2331-2) and 2332-1 (or 2332-2). A distance between the first edge 2311 of the second semiconductor chip 2310-1 (or 2310-2) and the first through vias 2331-1 (or 2331-2) may be less than a distance between the first edge 2311 and the second through vias 2332-1 (or 2332-2).

The second sub-package 2300-1 (or the third sub-package 2300-2) may further include first redistributed lines 2370-1 (or 2370-2). The first redistributed lines 2370-1 (or 2370-2) may be conductive patterns connecting the chip pads 2317-1 (or 2317-2) of the second semiconductor chip 2310-1 (or 2310-2) to the first through vias 2331-1 (or 2331-2). The second through vias 2332-1 (or 2332-2) may be disconnected from the first redistributed lines 2370-1 (or 2370-2) to be electrically isolated from the second semiconductor chip 2310-1 (or 2310-2).

Referring again to FIGS. 15 and 18, the second sub-package 2300-1 may be vertically stacked on the first sub-package 2200 such that the second layer of through vias 2331-1 and 2332-1 of the second interposing bridge 2330-1 overlap with respective through vias of the first layer of through vias 2231 and 2232 of the first interposing bridge 2230. The third sub-package 2300-2 may be vertically stacked on the second sub-package 2300-1 such that the second layer of through vias 2331-2 and 2332-2 of the second interposing bridge 2330-2 are electrically connected to respective through vias of the second layer of through vias 2331-1 and 2332-1 of the second interposing bridge 2330-1.

The first and second sub-packages 2200 and 2300-1 may be electrically connected to each other by inner connectors 2390, and the second and third sub-packages 2300-1 and 2300-2 may also be electrically connected to each other by the inner connectors 2390. Supporters 2360 may be disposed between the first and second sub-packages 2200 and 2300-1 such that the second sub-package 2300-1 is stably supported by the supporters 2360 and the inner connectors 2390.

The second semiconductor chip 2310-1 of the second sub-package 2300-1 may be electrically connected to the first semiconductor chip 2210 through electrical paths that are comprised of the first redistributed lines 2370-1, the inner connectors 2390, the first through vias 2231 of the first layer of through vias 2231 and 2232, and the first horizontal interconnection patterns 2121.

The second semiconductor chip 2310-2 of the third sub-package 2300-2 may be electrically connected to the first semiconductor chip 2210 through electrical paths that are comprised of the first redistributed lines 2370-2, the inner connectors 2390, the first through vias 2331-1 of the second layer of through vias 2231-1 and 2232-1, the inner connectors 2390, the first through vias 2231 of the first layer of through vias 2231 and 2232, and the first horizontal interconnection patterns 2121.

The second semiconductor chip 2310-1 of the second sub-package 2300-1 and the second semiconductor chip 2310-2 of the third sub-package 2300-2 may be electrically connected to the first semiconductor chip 2210 by using electrical paths, which are comprised of the first through vias 2231 of the first layer of through vias and the first horizontal interconnection patterns 2121 of the interconnection layer 2100, in common. That is, the second semiconductor chip 2310-1 of the second sub-package 2300-1 and the second semiconductor chip 2310-2 of the third sub-package 2300-2 may communicate with only the first semiconductor chip 2210 through the electrical common paths comprised of the first through vias 2231 and the first horizontal interconnection patterns 2121 regardless of the fourth and fifth sub-packages 2500-1 and 2500-2.

Figure 19:
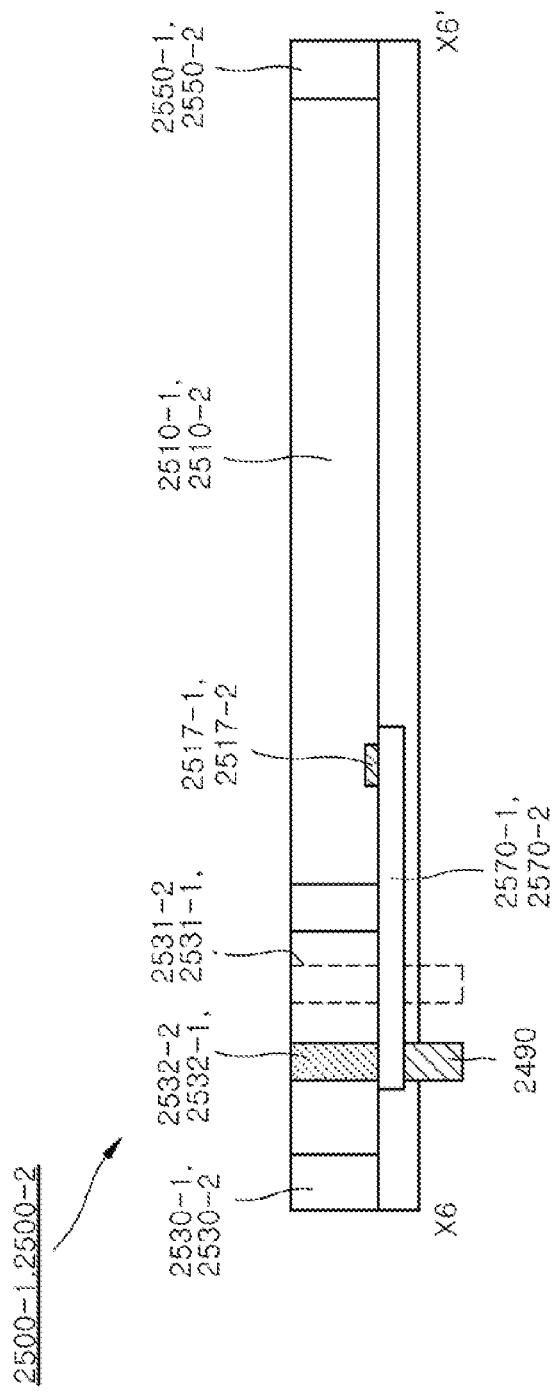
FIGS. 19 and 20 illustrate fourth and fifth sub-packages included in the semiconductor package of FIG. 15.
Figure 20:
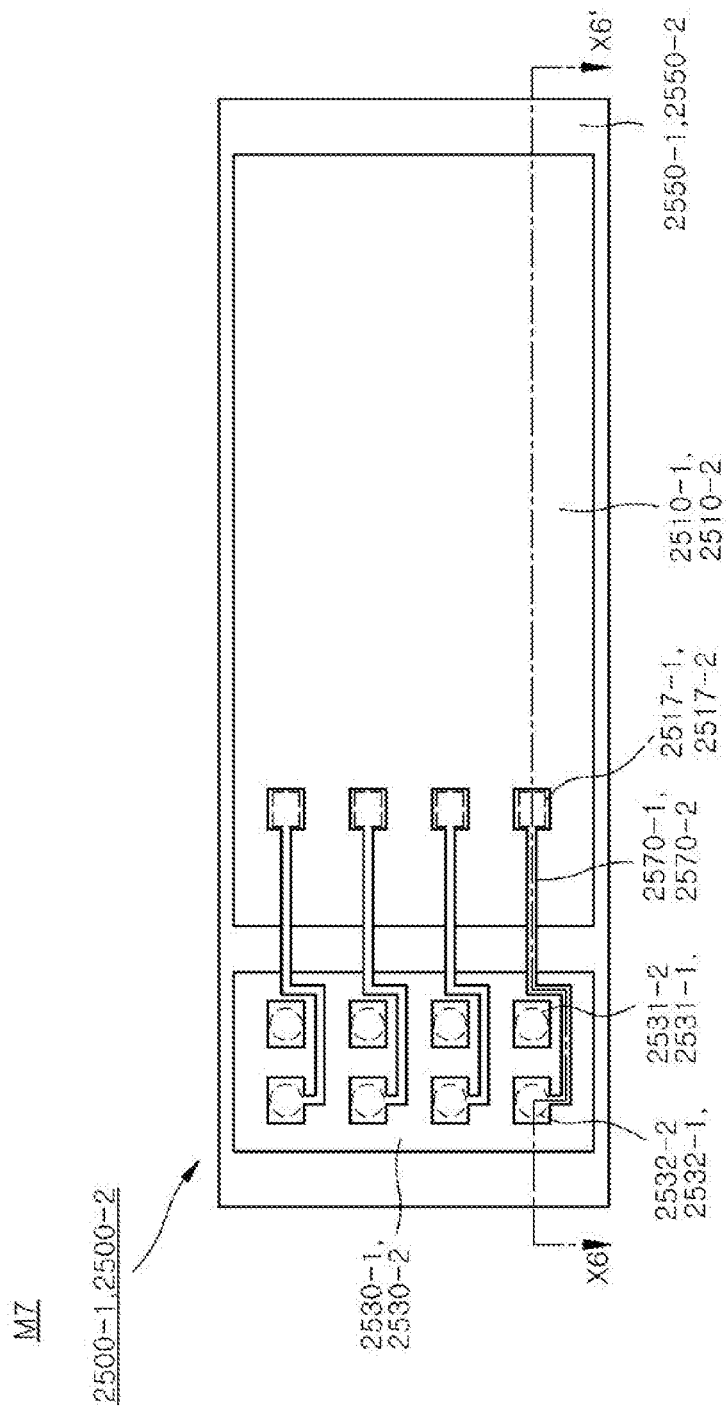

FIG. 19 is a cross-sectional view illustrating the fourth sub-package 2500-1 shown in FIG. 15. FIG. 20 is a plan view illustrating a layout M7 of second redistributed lines 2570-1 of the fourth sub-package 2500-1 shown in FIG. 19. FIG. 19 is a cross-sectional view taken along a line X6-X6' of FIG. 20.

Referring to FIGS. 15, 19, and 20, the fourth sub-package 2500-1 and the fifth sub-package 2500-2 may have the same configuration. The fourth sub-package 2500-1 (or the fifth sub-package 2500-2) may be configured to include a third semiconductor chip 2510-1 (or 2510-2), a third interposing bridge 2530-1 (or 2530-2), and a third encapsulant 2550-1 (or 2550-2). The third semiconductor chip 2510-1 (or 2510-2) may act as a storage chip storing data calculated by the first semiconductor chip 2210. The third semiconductor chip 2510-1 (or 2510-2) may have substantially the same configuration as the second semiconductor chip 2310-1 (or 2310-2).

The third interposing bridge 2530-1 (or 2330-2) may include a third layer of through vias 2531-1 (or 2531-2) and 2532-1 (or 2532-2). The fourth sub-package 2500-1 (or the fifth sub-package 2500-2) may further include the second redistributed lines 2570-1 (or 2570-2). The second redistributed lines 2570-1 (or 2570-2) may be conductive patterns connecting chip pads 2517-1 (or 2517-2) of the third semiconductor chip 2510-1 (or 2510-2) to the second through vias 2532-1 (or 2532-2) of the third layer of through vias. The first through vias 2531-1 (or 2531-2) of the third layer of through vias may be disconnected from the second redistributed lines 2570-1 (or 2570-2) to be electrically isolated from the third semiconductor chip 2510-1 (or 2510-2). The second redistributed lines 2570-1 (or 2570-2) may be disposed to detour the first through vias 2531-1 (or 2531-2) to be electrically disconnected from the first through vias 2531-1 (or 2531-2).

Referring again to FIGS. 15 and 20, the fourth sub-package 2500-1 may be vertically stacked on the third sub-package 2300-2 such that the third layer of through vias 2531-1 and 2532-1 of the third interposing bridge 2530-1 overlap with respective through vias of the second layer of through vias 2331-2 and 2332-2 of the second interposing bridge 2330-2. The fifth sub-package 2500-2 may be vertically stacked on the fourth sub-package 2500-1 such that the third layer of through vias 2531-2 and 2532-2 of the third interposing bridge 2530-2 are electrically connected to respective through vias of the third layer of through vias 2531-1 and 2532-1 of the third interposing bridge 2530-1.

The third and fourth sub-packages 2300-2 and 2500-1 may be electrically connected to each other by the inner connectors 2390, and the fourth and fifth sub-packages 2500-1 and 2500-2 may also be electrically connected to each other by the inner connectors 2390. The supporters 2360 may be disposed between the third and fourth sub-packages 2300-2 and 2500-1 such that the fourth sub-package 2500-1 is stably supported by the supporters 2360 and the inner connectors 2390.

The third semiconductor chip 2510-1 of the fourth sub-package 2500-1 may be electrically connected to the first semiconductor chip 2210 through electrical paths that are comprised of the second redistributed lines 2570-1, the inner connectors 2390, the second through vias 2332-2 of the second layer of through vias, the inner connectors 2390, the second through vias 2332-1 of the second layer of through vias, the inner connectors 2390, the second through vias 2232 of the first layer of through vias, and the second horizontal interconnection patterns 2122.

The third semiconductor chip 2510-2 of the fifth sub-package 2500-2 may be electrically connected to the first semiconductor chip 2210 through electrical paths that are comprised of the second redistributed lines 2570-2, the inner connectors 2390, the second through vias 2532-1 of the third layer of through vias, the inner connectors 2390, the second through vias 2332-2 of the second layer of through vias, the inner connectors 2390, the second through vias 2332-1 of the second layer of through vias, the inner connectors 2390, the second through vias 2332 of the first layer of through vias, and the second horizontal interconnection patterns 2122.

The third semiconductor chip 2510-1 of the fourth sub-package 2500-1 and the third semiconductor chip 2510-2 of the fifth sub-package 2500-2 may be electrically connected to the first semiconductor chip 2210 by using electrical paths, which are comprised of the second through vias 2332-2 of the second layer of through vias, the inner connectors 2390, the second through vias 2332-1 of the second layer of through vias, the inner connectors 2390, the second through vias 2332 of the first layer of through vias, and the second horizontal interconnection patterns 2122, in common. That is, the third semiconductor chip 2510-1 of the fourth sub-package 2500-1 and the third semiconductor chip 2510-2 of the fifth sub-package 2500-2 may communicate with only the first semiconductor chip 2210 through the electrical common paths comprised of the second through vias 2332-2 of the second layer of through vias, the inner connectors 2390, the second through vias 2332-1 of the second layer of through vias, the inner connectors 2390, the second through vias 2332 of the first layer of through vias, and the second horizontal interconnection patterns 2122 regardless of the second and third sub-packages 2300-1 and 2300-2.

Figure 21:
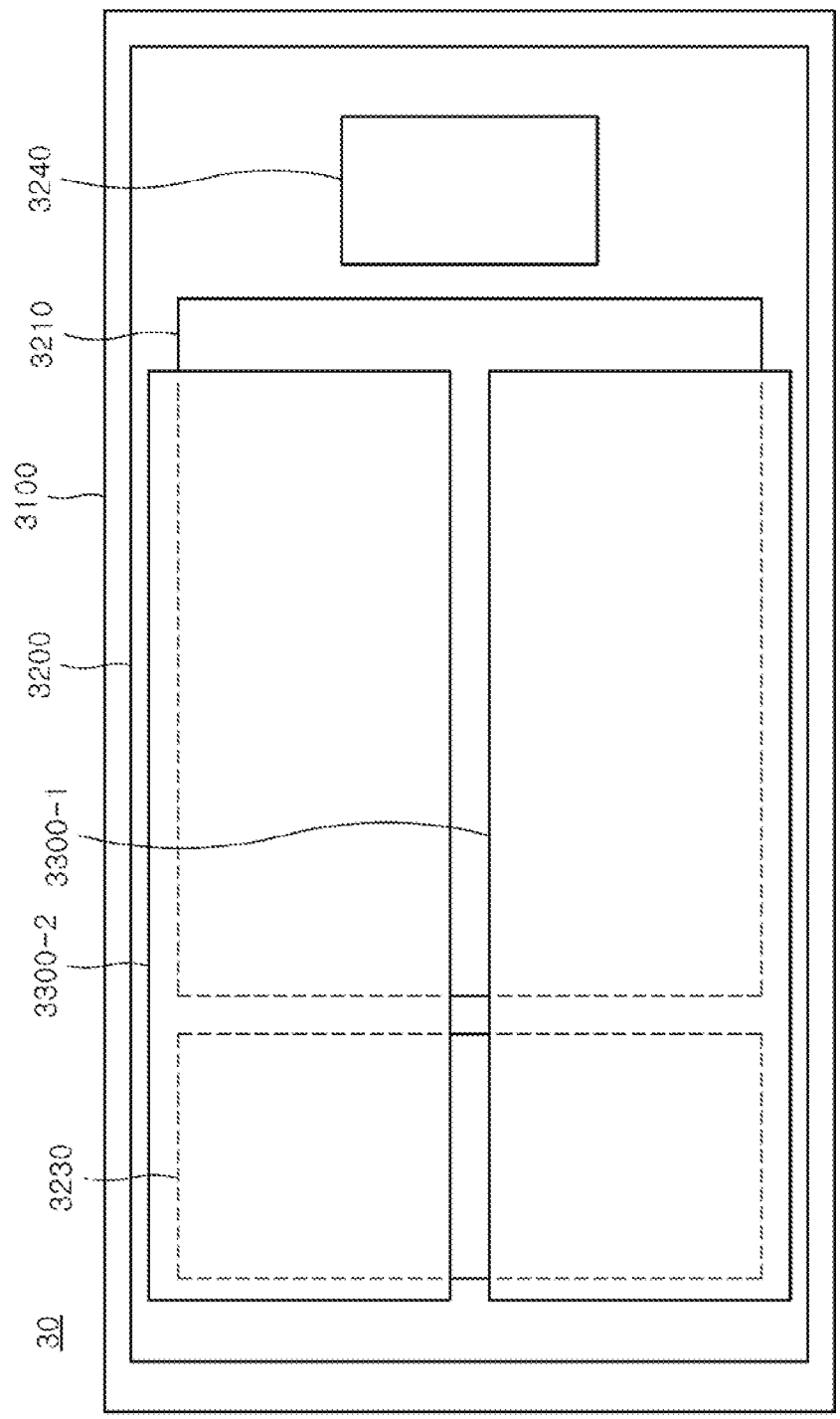
FIG. 21 is a plan view illustrating a semiconductor package according to still another embodiment.

FIG. 21 is a plan view illustrating a semiconductor package 30 according to still another embodiment.

Referring to FIG. 21, the semiconductor package 30 may be configured to include a first sub-package 3200 and a first stack 3300-1 and a second stack 3300-2 which are stacked on first sub-package 3200. The first stack 3300-1 and the second stack 3300-2 may be disposed side by side on the first sub-package 3200 to be laterally spaced apart from each other.

The first sub-package 3200 may have substantially the same configuration as the first sub-package 200 illustrated in FIG. 1. The first sub-package 3200 may be configured to include a first semiconductor chip 3210, a first interposing bridge 3230, and a fourth semiconductor chip 3240. The first sub-package 3200 may be stacked on an interconnection layer 3100. The interconnection layer 3100 may have substantially the same configuration as the interconnection layer 100 illustrated in FIG. 1. The first sub-package 3200 may have substantially the same configuration as the first sub-package 200 illustrated in FIG. 1. The first semiconductor chip 3210, the first interposing bridge 3230, and the fourth semiconductor chip 3240 may have substantially the same configurations as the first semiconductor chip 210, the first interposing bridge 230, and the sixth semiconductor chip 220 which are illustrated in FIG. 1, respectively. The first stack 3300-1 may be configured to have substantially the same stack structure as a stack of the second to fifth sub-packages 300, 400, 500, and 600 illustrated in FIG. 1. In addition, the second stack 3300-2 may also be configured to have substantially the same stack structure as a stack of the second to fifth sub-packages 300, 400, 500, and 600 illustrated in FIG. 1.

The interconnection layer 3100 may include a third horizontal interconnection patterns (not shown) corresponding to the third horizontal interconnection patterns 126 included in the interconnection layer 100 illustrated in FIG. 1 for communication between the first semiconductor chip 3210 and the fourth semiconductor chip 3240.

The first semiconductor chip 3210 may be an application processor (AP), and the fourth semiconductor chip 3240 may be a buffer memory chip. Wide input/output (I/O) paths having at least 256 paths or at least 512 paths may be disposed between the first semiconductor chip 3210 and the fourth semiconductor chip 3240 for communication between the first semiconductor chip 3210 and the fourth semiconductor chip 3240. In order to establish the wide I/O paths, the third horizontal interconnection patterns of the interconnection layer 3100 may include at least 256 conductive patterns or at least 512 conductive patterns. A signal or data transmission speed between the first semiconductor chip 3210 and the fourth semiconductor chip 3240 may be improved by the wide I/O paths.

When the first stack 3300-1 is configured to include the second to fifth sub-packages (300, 400, 500, and 600 of FIG. 1), the first semiconductor chip 3210 and the first stack 3300-1 may communicate with each other through at least sixty four I/O paths. Because each of the sub-packages 300, 400, 500, and 600 included in the first stack 3300-1 or the second stack 3300-2 independently communicates with the first semiconductor chip 3210, each of the first, second, fourth, and fifth horizontal interconnection patterns (121, 122, 123, and 124 of FIG. 1) may include sixteen conductive patterns. As such, a signal or data transmission speed between the first semiconductor chip 3210 and the first stack 3300-1 (or the second stack 3300-2) may be improved by the wide I/O paths.

In an embodiment, the first sub-package 3200 of the semiconductor package 30 may have substantially the same configuration as the first sub-package 2200 illustrated in FIG. 15. Each of the first stack 3300-1 and the second stack 3300-2 may have substantially the same configuration as a stack of the second to fifth sub-packages 2300-1, 2300-2, 2500-1, and 2500-2.

Referring again to FIG. 1, the semiconductor package 10 may be configured to include the first sub-package 200 stacked on the interconnection layer 100 and the second and third sub-packages 300 and 400 sequentially stacked on the first sub-package 200. The first to third sub-packages 200, 300, and 400 may be configured to include the first, second, and third semiconductor chips 210, 310, and 410, respectively. In addition, the first to third sub-packages 200, 300, and 400 may be configured to include the first, second, and third interposing bridges 230, 330, and 430, respectively. The interposing bridges 230, 330, and 430 may include the first through vias 231, 331, and 431 and the second through vias 232, 332, and 432.

The second sub-package 300 may further include the first redistributed lines 370 electrically connecting the semiconductor chip 310 of the second sub-package 300 to the first through vias 231, 331, and 431, and the third sub-package 400 may further include the second redistributed lines 470 electrically connecting the semiconductor chip 410 of the third sub-package 400 to the second through vias 232, 332, and 432.

Figure 22:
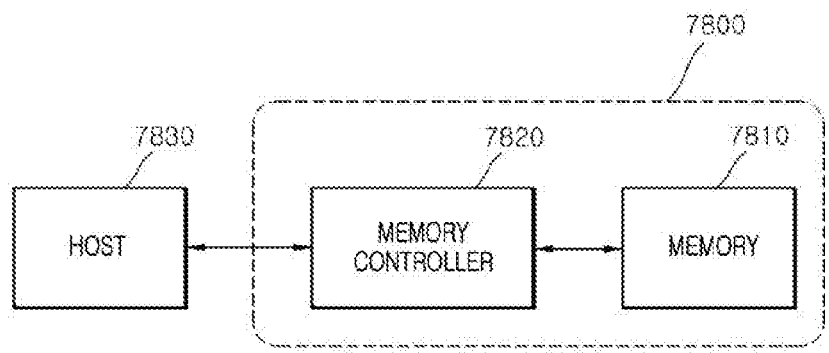
FIG. 22 is a block diagram illustrating an electronic system employing a memory card including at least one of semiconductor packages according to the embodiments.

FIG. 22 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 23:
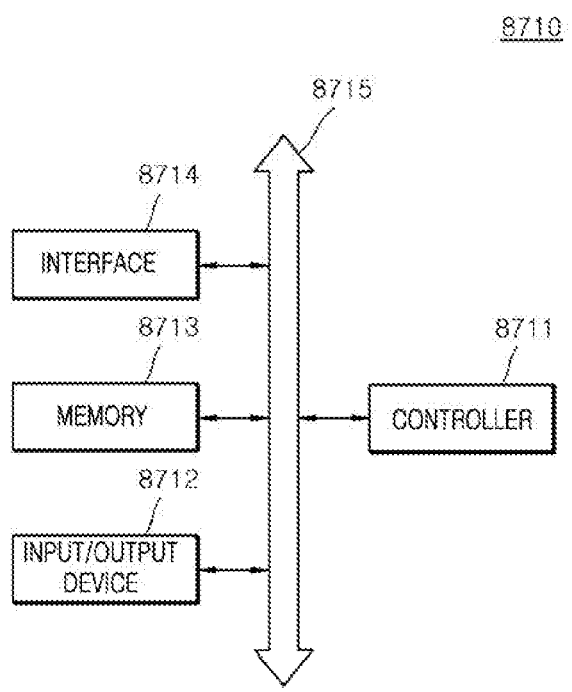
FIG. 23 is a block diagram illustrating another electronic system including at least one of semiconductor packages according to the embodiments.

FIG. 23 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
   an interconnection layer;
   a first sub-package on the interconnection layer; and
   a second sub-package and a third sub-package sequentially stacked on the first sub-package,
   wherein the first sub-package includes:
      a first semiconductor chip; and
      a first interposing bridge spaced apart from the first semiconductor chip and configured to include a first layer of through vias,
   wherein the second sub-package includes:
      a second semiconductor chip;
      a second interposing bridge spaced apart from the second semiconductor chip and configured to include a second layer of through vias which overlap with respective through vias of the first layer of through vias and which are electrically connected to the respective through vias of the first layer of through vias; and
      a first redistributed line electrically connecting the second semiconductor chip to a first through via of the second layer of through vias, and
   wherein the third sub-package includes:
      a third semiconductor chip;
      a third interposing bridge spaced apart from the third semiconductor chip and configured to include a third layer of through vias which overlap with respective through vias of the second layer of through vias and which are electrically connected to the respective through vias of the second layer of through vias; and
      a second redistributed line electrically connecting the third semiconductor chip to a second through via of the third layer of through vias.

2. The semiconductor package of claim 1,
   wherein the second semiconductor chip includes a first edge facing the second interposing bridge and a second edge opposite to the first edge;
   wherein the second semiconductor chip further includes a chip pad electrically connected to the first redistributed line; and
   wherein a distance between the chip pad and the first edge of the second semiconductor chip is less than a distance between the chip pad and the second edge of the second semiconductor chip.

3. The semiconductor package of claim 1, wherein the second and third sub-packages are vertically stacked on the first sub-package such that the first, second, and third interposing bridges overlap with one another.

4. The semiconductor package of claim 1, wherein a second through via of the second layer of through vias of the second interposing bridge is disposed to be electrically isolated from the second semiconductor chip.

5. The semiconductor package of claim 1, further comprising inner connectors disposed between the second interposing bridge of the second sub-package and the first interposing bridge of the first sub-package.

6. The semiconductor package of claim 5, further comprising supporters which are disposed between the second sub-package and the first sub-package to overlap with the second semiconductor chip and which are spaced apart from the inner connectors.

7. The semiconductor package of claim 6, wherein the supporters include dummy bumps.

8. The semiconductor package of claim 1,
   wherein the first sub-package further includes a first encapsulant covering the first semiconductor chip and the first interposing bridge;
   wherein the second sub-package further includes a second encapsulant covering the second semiconductor chip and the second interposing bridge; and
   wherein the third sub-package further includes a third encapsulant covering the third semiconductor chip and the third interposing bridge.

9. The semiconductor package of claim 8, wherein the first redistributed line extends from the second semiconductor chip to pass over a portion of a surface of the second encapsulant and electrically contacts the first through via of the second layer of through vias.

10. The semiconductor package of claim 8, wherein the second redistributed line extends from the third semiconductor chip to pass over a portion of a surface of the third encapsulant, detours a first through via of the third layer of through vias to be spaced apart from a first through via of the third layer of through vias, and electrically contacts the second through via of the third layer of through vias.

11. The semiconductor package of claim 1,
    wherein the first sub-package further includes an auxiliary semiconductor chip located at a side of the first semiconductor chip opposite to the first interposing bridge;
    wherein the first semiconductor chip includes a processor chip;
    wherein the auxiliary semiconductor chip corresponds to a buffer memory chip used as a cache memory when the processor chip operates; and
    wherein the second and third semiconductor chips correspond to storage chips for storing data calculated by the processor chip.

12. The semiconductor package of claim 11, wherein the interconnection layer includes:
    a dielectric layer;
    a first horizontal interconnection pattern disposed in the dielectric layer to electrically connect a first through via of the first layer of through vias to the first semiconductor chip;
    a second horizontal interconnection pattern disposed in the dielectric layer to electrically connect a second through via of the first layer of through vias to the first semiconductor chip; and
    a third horizontal interconnection pattern disposed in the dielectric layer to electrically connect the auxiliary semiconductor chip to the first semiconductor chip.

13. A semiconductor package comprising:
    an interconnection layer;
    a first sub-package on the interconnection layer; and
    a second sub-package, a third sub-package, a fourth sub-package, and a fifth sub-package sequentially stacked on the first sub-package,
    wherein the first sub-package includes:
       a first semiconductor chip; and
       a first interposing bridge spaced apart from the first semiconductor chip and configured to include a first layer of through vias,
    wherein each of the second and third sub-packages includes:
       a second semiconductor chip;
       a second interposing bridge spaced apart from the second semiconductor chip and configured to include a second layer of through vias which overlap with respective through vias of the first layer of through vias and which are electrically connected to the respective through vias of the first layer of through vias; and a first redistributed line electrically connecting the second semiconductor chip to a first through via of the second layer of through vias, and wherein each of the fourth and fifth sub-packages includes:

a third semiconductor chip;

a third interposing bridge spaced apart from the third semiconductor chip and configured to include a third layer of through vias which overlap with respective through vias of the second layer of through vias and which are electrically connected to the respective through vias of the second layer of through vias; and a second redistributed line electrically connecting the third semiconductor chip to a second through via of the third layer of through vias.

14. The semiconductor package of claim 13,
wherein the second and third sub-packages have the same configuration; and
wherein the fourth and fifth sub-packages have the same configuration.

15. The semiconductor package of claim 13,
wherein the second semiconductor chip includes a first edge facing the second interposing bridge and a second edge opposite to the first edge;
wherein the second semiconductor chip further includes a chip pad electrically connected to the first redistributed line; and
wherein a distance between the chip pad and the first edge of the second semiconductor chip is less than a distance between the chip pad and the second edge of the second semiconductor chip.

16. The semiconductor package of claim 13, wherein a second through via of the second layer of through vias of the second interposing bridge is disposed to be electrically isolated from the second semiconductor chip.

17. The semiconductor package of claim 13, further comprising inner connectors disposed between the second interposing bridge of the second sub-package and the first interposing bridge of the first sub-package.

18. The semiconductor package of claim 17, further comprising supporters which are disposed between the second sub-package and the first sub-package to overlap with the second semiconductor chip and which are spaced apart from the inner connectors.

19. The semiconductor package of claim 18, wherein the supporters include dummy bumps.

20. The semiconductor package of claim 13,
wherein the first sub-package further includes an auxiliary semiconductor chip located at a side of the first semiconductor chip opposite to the first interposing bridge, and
wherein the interconnection layer includes:
a dielectric layer;
a first horizontal interconnection pattern disposed in the dielectric layer to electrically connect a first through via of the first layer of through vias to the first semiconductor chip;
a second horizontal interconnection pattern disposed in the dielectric layer to electrically connect a second through via of the first layer of through to the first semiconductor chip; and
a third horizontal interconnection pattern disposed in the dielectric layer to electrically connect the auxiliary semiconductor chip to the first semiconductor chip.

21. A semiconductor package comprising:
an interconnection layer;
a first sub-package on the interconnection layer; and
a second sub-package and a third sub-package sequentially stacked on the first sub-package,
wherein each of the first, second, and third sub-packages includes:
a semiconductor chip; and
an interposing bridge spaced apart from the semiconductor chip and configured to include a first through via and a second through via,
wherein the second sub-package further includes a first redistributed line electrically connecting the semiconductor chip of the second sub-package to the first through via, and
wherein the third sub-package further includes a second redistributed line electrically connecting the semiconductor chip of the third sub-package to the second through via.

* * * * *